(12) United States Patent
Masuoka et al.

(10) Patent No.: US 7,387,935 B2
(45) Date of Patent: Jun. 17, 2008

(54) MEMORY CELL UNIT, NONVOLATILE SEMICONDUCTOR STORAGE DEVICE INCLUDING MEMORY CELL UNIT, AND MEMORY CELL ARRAY DRIVING METHOD

(75) Inventors: Fujio Masuoka, 2-33-18 Higashikatsuyama, Aoba-ku, Miyagi, Sendai-shi (JP) 981-0923; Hiroshi Sakuraba, Sendai (JP); Fumiyoshi Matsuoka, Sendai (JP); Syounosuke Ueno, Fujiidera (JP); Ryusuke Matsuyama, Nara (JP); Shinji Horii, Fukuyama (JP); Takuji Tanigami, Fukuyama (JP)

(73) Assignees: Fujio Masuoka, Miyagi (JP); Sharp Kabushiki Kaisha, Osaka (JP)

( * ) Notice: Subject to any disclaimer, the term of this patent is extended or adjusted under 35 U.S.C. 154(b) by 309 days.

(21) Appl. No.: 10/941,505

(22) Filed: Sep. 14, 2004

(65) Prior Publication Data

US 2005/0063237 A1 Mar. 24, 2005

(30) Foreign Application Priority Data

Sep. 18, 2003 (JP) ............................. 2003-326466

(51) Int. Cl.
*H01L 21/336* (2006.01)
*G11C 16/04* (2006.01)

(52) U.S. Cl. ..................... 438/259; 438/201; 438/257; 365/185.26

(58) Field of Classification Search ........... 365/185.05, 365/185.06, 185.08, 185.25, 185.26, 189.01; 438/201, 257, 259; 257/E27.103
See application file for complete search history.

(56) References Cited

U.S. PATENT DOCUMENTS

| 6,101,128 | A  | * | 8/2000 | Yamauchi ............... 365/185.28 |
| 6,707,701 | B2 | * | 3/2004 | Ashikaga .................... 365/145 |
| 6,727,544 | B2 |   | 4/2004 | Endoh et al. |
| 7,221,586 | B2 | * | 5/2007 | Forbes et al. ........... 365/185.05 |

FOREIGN PATENT DOCUMENTS

| JP | 04-079369     | 3/1992 |
| JP | 2002-057231   | 2/2002 |
| KR | 1020030002986 A | 1/2003 |

* cited by examiner

*Primary Examiner*—Hung Vu
(74) *Attorney, Agent, or Firm*—Morrison & Foerster LLP

(57) ABSTRACT

A memory cell unit including: a semiconductor substrate having a source diffusion layer in at least a part of a surface thereof; a column-shaped semiconductor layer provided on the semiconductor substrate, and having a drain diffusion layer provided in an uppermost portion thereof and a first low concentration impurity diffusion layer provided in an entire bottom portion thereof; a memory cell arrangement which includes a plurality of memory cells provided in a peripheral wall of the column-shaped semiconductor layer and connected in series perpendicularly to the substrate, the memory cells each having a charge storage layer and a control gate; a second impurity diffusion layer provided at a lower end of the memory cell arrangement; and a selection transistor having a gate electrode provided around the peripheral wall of the column-shaped semiconductor layer and connecting the second impurity diffusion layer and the first impurity diffusion layer; wherein the first impurity diffusion layer extends into a part of a channel region provided in the peripheral wall of the column-shaped semiconductor layer in opposed relation to the gate electrode of the selection transistor.

8 Claims, 17 Drawing Sheets

MEMORY CELL UNIT, NONVOLATILE SEMICONDUCTOR STORAGE DEVICE INCLUDING MEMORY CELL UNIT, AND MEMORY CELL ARRAY DRIVING METHOD

CROSS-REFERENCE TO RELATED APPLICATION

This application is related to Japanese application No.2003-326466 filed on Sep. 18, 2003 whose priority is claimed under 35 USC §119, the disclosure of which is incorporated by reference in its entirety.

BACKGROUND OF THE INVENTION

1. Field of the Invention

The present invention relates to a memory cell unit, a nonvolatile semiconductor storage device including such a memory cell unit, and a memory cell array driving method.

2. Description of the Related Art

Exemplary memory cells of a known EEPROM are of a MOS transistor structure, which includes a gate portion including a charge storage layer and a control gate and is adapted to inject electric charges into the charge storage layer and release the electric charges from the charge storage layer by utilizing a tunnel current. The memory cells each store data "0" and "1" on the basis of a difference in threshold voltage attributable to a difference in the charge storage state of the charge storage layer.

In the case of an n-channel memory cell having a floating gate as the charge storage layer, for example, a positive high voltage is applied to the control gate with source and drain diffusion layers and a substrate being grounded for the injection of electrons into the floating gate. At this time, the electrons are injected into the floating gate from the substrate by the tunnel current. Thus, the threshold voltage of the memory cell is positively shifted by the injection of the electrons. For the release of the electrons from the floating gate, on the other hand, a negative voltage is applied to the control gate with the source and drain diffusion layers and the substrate being grounded. At this time, the electrons are released from the floating gate to the substrate by the tunnel current. Thus, the threshold voltage of the memory cell is negatively shifted by the release of the electrons. In the aforesaid operation, a relationship between a floating gate/control gate coupling capacitance and a floating gate/substrate coupling capacitance is important for efficiently achieving the electron injection and the electron release, i.e., for the writing and the erasing. In other words, as the capacitance between the floating gate and the control gate is increased, the potential of the control gate can more effectively be transferred to the floating gate, thereby facilitating the writing and the erasing.

With the recent progress of the semiconductor technology, particularly the micro-processing technique, the size reduction and capacity increase of memory cells of EEPROMs are rapidly promoted. Therefore, how to reduce the area of the memory cells and how to increase the capacitance between the floating gate and the control gate are critical issues. In order to increase the capacitance between the floating gate and the control gate, it is necessary to reduce the thickness of a gate insulation film provided between the floating gate and the control gate, to increase the dielectric constant of the gate insulation film, or to increase the area of opposed surfaces of the floating gate and the control gate. However, the thickness reduction of the gate insulation film has limitation in consideration of the reliability. A conceivable approach to the increase of the dielectric constant of the gate insulation film is to employ a silicon nitride film or the like instead of a silicon oxide film. However, this approach poses a problem associated with the reliability and, hence, is not practical. Therefore, it is necessary to increase an overlap between the floating gate and the control gate to not smaller than a predetermined area in order to provide a sufficient capacitance. However, this is obstructive to the reduction of the area of the memory cells for the increase of the storage capacity of the EEPROM. Hence, there is a demand for means for achieving both the reduction of the memory cell area and the increase of the capacitance between the floating gate and the control gate.

There is known an EEPROM including a plurality of memory cell units, as shown in FIG. 18, which each include two memory cells provided on a column-shaped semiconductor layer 12 and selection transistors disposed above and below the memory cells (see, for example, Japanese Unexamined Patent Publication No. Hei 4-79369 (1992)). The memory cells are constructed by utilizing a peripheral wall of each of column-shaped semiconductor layers arranged in a matrix configuration and isolated from each other by a lattice trench formed in a semiconductor substrate. That is, the memory cell units each include a drain diffusion layer 7 provided in an upper surface of the column-shaped semiconductor layer, a common source diffusion layer 11 provided in a bottom of the trench, and charge storage layers 1, 3 and control gates 2, 4 entirely surrounding the peripheral wall of the column-shaped semiconductor layer. Control gate lines are each provided by sequentially connecting control gates provided around column-shaped semiconductor layers serially arranged in one direction. Bit lines are each connected to drain diffusion layers of memory cell units sequentially arranged as crossing the control gate lines. Where the memory cells each have a one-transistor-per-cell structure, a cell current flows into unselected cells (or a reading error occurs) if the memory cells are over-erased with a read potential of 0V and a negative threshold voltage. To assuredly prevent this phenomenon, the selection transistors are disposed in series to the memory cells in upper and lower portions of the column-shaped semiconductor layer with gate electrodes 5, 6 thereof at least partly surrounding the peripheral surface of the column-shaped semiconductor layer.

Thus, the memory cells of the conventional EEPROM each include the charge storage layer and the control gate formed as surrounding the column-shaped semiconductor layer by utilizing the peripheral wall of the column-shaped semiconductor layer. Therefore, the capacitance between the charge storage layer and the control gate can sufficiently be increased with a smaller memory cell area. Further, the drain diffusion layers of the memory cell units connected to the bit lines are respectively provided in the upper surfaces of the column-shaped semiconductor layers, and electrically isolated from each other by the trench. Thus, a device isolation area can be reduced, thereby further reducing the memory cell size. Therefore, it is possible to provide large storage capacity memory cell units in which memory cells each having an excellent writing/erasing efficiency are integrated.

It is herein assumed that plural memory cells connected in series on each of the column-shaped semiconductor layers have the same threshold voltage. Here, a reading operation is performed by applying a read potential to control gates (CG) of the memory cells for determination of "0" or "1" depending on the presence or absence of an electric current. If the electric current flowing through the semiconductor layer causes a potential difference between the memory cells located at opposite ends of the serial memory cell arrangement on the single semiconductor layer due to a resistant component of the semiconductor layer, the potential difference makes the threshold voltages of the respective memory cells non-uniform (back bias effect). This enhances fluctuation in the threshold voltages. The back bias effect limits the number of memory cells to be connected in series on the device, thereby posing a problem associated with the increase of the storage capacity. Further, the back bias effect may occur not only where the plural memory cells are connected in series on the single column-shaped semiconductor layer, but also where a single memory cell is provided on the single column-shaped semiconductor layer. That is, the threshold voltages of the respective memory cells are liable to be non-uniform due to variation in an in-plane back bias effect of the semiconductor substrate. The variations in the threshold voltages depending on the positions of the memory cells adversely influence write/erase/read voltages to be applied for the writing, erasing and reading operations with respect to the memory cells. Hence, there is a demand for a solution to the problem associated with the back bias effect of the substrate.

On the other hand, there is also known a memory cell unit in which a column-shaped semiconductor layer is electrically isolated from a semiconductor substrate as shown in FIG. 19 (see, for example, Japanese Unexamined Patent Publication No. 2002-57231). By thus electrically isolating the column-shaped semiconductor layer from the semiconductor substrate, the back bias effect can be suppressed. Therefore, a memory cell unit having an improved integration density can be provided, in which the coupling ratio of the floating gate/control gate coupling capacitance is further increased without increasing the area of the memory cells, and the variations in cell characteristics attributable to the production process are suppressed.

When a writing operation is performed in a semiconductor storage device including memory cell units each having the aforesaid construction, a high writing prevention voltage is applied to bit lines not subjected to the writing operation. In general, the memory cell units are arranged longitudinally and transversely in a matrix configuration in the semiconductor storage device. Control gates of memory cells provided in memory cell units (column-shaped semiconductor layers) arranged longitudinally in each column of the matrix configuration are connected commonly to corresponding control gate lines, and selection gates of selection transistors provided in memory cell units (column-shaped semiconductor layers) arranged longitudinally in each column of the matrix configuration are connected commonly to corresponding selection gate lines. Drain diffusion layers provided in memory cell units (column-shaped semiconductor layers) arranged transversely in each row of the matrix configuration are connected commonly to a bit line. When a writing operation is performed on a selected memory cell in this memory cell unit array, electrons are injected into the selected memory cell by applying a positive writing voltage to a control gate line connected to the control gate of the selected memory cell, applying a grounding voltage or a positive voltage to a source diffusion layer and applying a grounding voltage to a drain diffusion layer of the memory cell unit including the selected memory cell. At this time, a channel formed below a selection gate of a selection transistor adjacent to the drain diffusion layer is electrically connected to a channel formed below a control gate of a memory cell adjacent to the selection transistor, so that the potentials of the channels are virtually equalized with the grounding voltage applied to the drain diffusion layer. Further, the writing to unselected memory cells which share the control gate line with the selected memory cell is prevented by applying a positive writing prevention voltage to bit lines connected to memory cell units not including the selected memory cell. Where the selected memory cell is a memory cell disposed closest to the source diffusion layer in the memory cell unit, a sufficiently high voltage is applied to control gates of memory cells disposed on an upper side of the selected memory cell and the selection gate of the selection transistor adjacent to the drain diffusion layer for the electron injection from the drain diffusion layer. Therefore, the same voltage is applied to control gates and selection gates in the memory cell units not including the selected memory cells which share the control gate line and the selection gate line with the selected memory cell. If this voltage is sufficiently high, the channel formed below the selection gate adjacent to the drain diffusion layer is electrically connected to the channel formed below the control gate of the memory cell adjacent to the selection gate. Therefore, the potentials of the channels are virtually equalized with the positive writing prevention voltage applied to the drain diffusion layer via the bit line. Thus, the electron injection to charge storage layers of the unselected memory cells is prevented, because a potential difference between the charge storage layers and the control gates to which the writing voltage is applied is sufficiently small. Then, the potential of an impurity diffusion layer disposed between the lowermost memory cell and the selection transistor adjacent to the source diffusion layer is virtually equalized with the writing prevention voltage.

However, if the selection transistor adjacent to the source diffusion layer has a breakdown voltage lower than the bit line writing prevention voltage, an electric current flows into the channel formed below the gate electrode even with the selection transistor being off. This results in breakdown of the selection transistor. As a result, the voltage (inter-channel voltage) of the impurity diffusion layer between the lowermost memory cell and the selection transistor adjacent to the source diffusion layer with respect to the source diffusion layer is reduced to a level equivalent to the breakdown voltage of the source side selection transistor (which is lower than the bit line writing prevention voltage). Therefore, the channel potential of the lowermost memory cell is reduced. Hence, there is a possibility that a writing error occurs on the charge storage layer of the memory cell due to the voltage difference between the source side selection transistor and the control gate.

In order to prevent the writing error due to the insufficient breakdown voltage of the selection transistor, the voltage applied to the source diffusion layer should be stabilized, and the source side selection transistor should have a sufficient breakdown voltage with respect to the writing prevention voltage. This is because the potential of the impurity diffusion layer is equivalent to the sum of the voltage of the source diffusion layer with respect to the grounding potential and the voltage of the selection transistor between the source diffusion layer and the impurity diffusion layer.

Where a positive source voltage is applied to the source diffusion layer, the stability of the voltage of the source diffusion layer is influenced by the breakdown voltage of the selection transistor of the memory cell unit including the selected memory cell. As described above, the potential of the channel of the selected memory cell is virtually equivalent to the grounding voltage applied to the drain diffusion layer, so that the potential of the adjacent impurity diffusion layer is equivalent to the channel potential. Therefore, if the breakdown voltage of the selection transistor between the impurity diffusion layer and the source diffusion layer is lower than the source voltage, the breakdown occurs, so that the voltage of the source diffusion layer with respect to the grounding voltage is reduced to the level equivalent to the breakdown voltage of the source side selection transistor. Therefore, the voltages of the source diffusion layers of the other memory cell units which share the selection gate line are also reduced to the level equivalent to the breakdown voltage.

In general, the breakdown voltage of a minute transistor is determined by a minimum distance between a source and a drain disposed on opposite sides of a channel of the transistor. Therefore, the breakdown voltage of the aforesaid selection transistor is determined by a minimum distance between the source diffusion layer and the impurity diffusion layer disposed between the lowermost memory cell and the selection transistor. Hence, the breakdown voltage of the transistor can be increased by sufficiently increasing the inter-channel distance. However, the increase of the inter-channel distance means that the column-shaped semiconductor layers should be formed as having a greater height. This means that a semiconductor layer should be formed as having a greater thickness and unnecessary portions of the semiconductor layer should be removed to a greater depth for formation of the column-shaped semiconductor layers in a semiconductor device production process. Therefore, the semiconductor device production process is time-consuming, resulting in cost increase. Hence, it is not preferred to unreasonably increase the inter-channel distance.

Another method for allowing the selection transistor to have a breakdown voltage sufficient for the driving of the memory cell array is to give consideration to the construction of the selection transistor. Further, consideration may be given to a memory cell array driving method in the writing operation.

SUMMARY OF THE INVENTION

In view of the foregoing, the present invention is directed to a memory cell unit constructed so that a source side selection transistor has a sufficient breakdown voltage for prevention of erroneous writing to a memory cell, and to a memory cell array driving method which prevents erroneous writing even if a selection transistor has a breakdown voltage lower than a writing prevention voltage.

According to a first aspect of the present invention, there is provided a memory cell unit, which comprises: a semiconductor substrate having a high concentration impurity diffusion layer provided as a source diffusion layer in at least a part of a surface thereof; a column-shaped semiconductor layer provided on the semiconductor substrate perpendicularly to the semiconductor substrate, and having a drain diffusion layer provided in an uppermost portion thereof and a first low concentration impurity diffusion layer provided in an entire bottom portion thereof; a memory cell arrangement which includes a plurality of memory cells provided in a peripheral wall of the column-shaped semiconductor layer and connected in series perpendicularly to the substrate, the memory cells each having a charge storage layer and a control gate; a second impurity diffusion layer provided at a lower end of the memory cell arrangement; and a selection transistor having a gate electrode provided around the peripheral wall of the column-shaped semiconductor layer and connecting the second impurity diffusion layer and the first impurity diffusion layer; wherein the first impurity diffusion layer extends into a part of a channel region provided in the peripheral wall of the column-shaped semiconductor layer in opposed relation to the gate electrode of the selection transistor.

According to a second aspect of the present invention, there is provided a memory cell array driving method for performing a writing operation on a selected memory cell in a memory cell array including a plurality of memory cell units arranged longitudinally and transversely in a matrix configuration and control gate lines, the memory cell units each comprising a semiconductor substrate having a high concentration impurity diffusion layer provided as a source diffusion layer in at least a part of a surface thereof, a column-shaped semiconductor layer provided on the semiconductor substrate perpendicularly to the semiconductor substrate and having a drain diffusion layer provided in an uppermost portion thereof and a first low concentration impurity diffusion layer provided in an entire bottom portion thereof, the column-shaped semiconductor layer being electrically isolated from the semiconductor substrate, a memory cell arrangement which includes a plurality of memory cells provided in a peripheral wall of the column-shaped semiconductor layer and connected in series perpendicularly to the substrate, the memory cells each having a charge storage layer and a control gate, a second impurity diffusion layer provided at a lower end of the memory cell arrangement, and a selection transistor connecting the second impurity diffusion layer and the first impurity diffusion layer, the control gates of the memory cells being connected commonly to the corresponding control gate lines, the driving method comprising the steps of: applying a positive source voltage to the source diffusion layers of the respective memory cell units; applying a grounding voltage to a drain diffusion layer of a memory cell unit including the selected memory cell; applying a writing voltage to a control gate line connected to the selected memory cell; and applying a writing prevention voltage to drain diffusion layers of memory cell units not including the selected memory cell for prevention of writing to unselected memory cells which share the control gate line connected to the selected memory cell.

According to the present invention, the column-shaped semiconductor layer contacts the high concentration source diffusion layer with the intervention of the first low concentration impurity diffusion layer provided in the bottom portion thereof as extending to the channel region of the selection transistor. When a voltage is applied between opposite sides of the channel of the selection transistor of the memory cell unit including the selected memory cell for the writing to the selected memory cell, a depletion layer spreads into the first impurity diffusion layer. Therefore, the field intensity is prevented from being locally concentrated. As a result, the selection transistor has a sufficient breakdown voltage, so that the positive source voltage applied to the source diffusion layer is stabilized. Therefore, the channel potentials of the unselected memory cells can stably be kept at the writing prevention voltage, thereby assuredly preventing the erroneous writing to the unselected memory cells. That is, the memory cell unit is highly reliable and stably operable.

In the memory cell array driving method according to the present invention, the writing to the charge storage layer of the selected memory cell is achieved by applying the positive source voltage to the source diffusion layers of the respective memory cell units, applying the grounding voltage to the drain diffusion layer of the memory cell unit including the selected memory cell, applying the writing voltage to the control gate line connected to the selected memory cell, and applying the writing prevention voltage to the drain diffusion layers of the memory cell units not including the selected memory cell for prevention of the writing to the unselected memory cells which share the control gate line connected to the selected memory cell. Therefore, the selection transistors of the memory cell units are merely required to have a breakdown voltage which is not lower than a difference between the writing prevention voltage and the source voltage. Thus, the erroneous writing can be prevented even if the breakdown voltage is not higher than the writing prevention voltage.

DETAILED DESCRIPTION OF THE INVENTION

Figure 1:
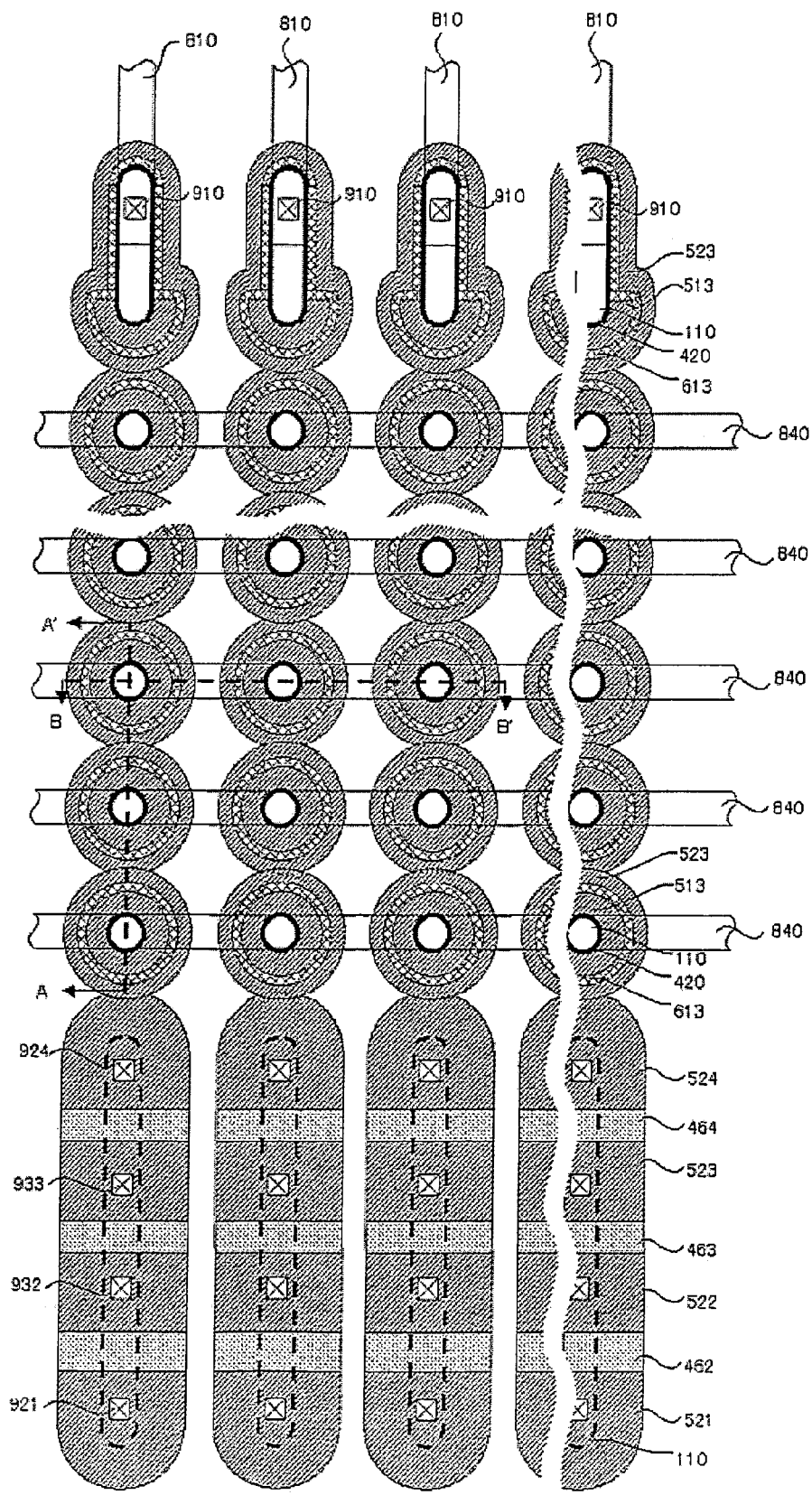
FIG. 1 is a plan view illustrating a memory cell unit array according to a first embodiment of the present invention.

A memory cell unit according to the present invention comprises: a semiconductor substrate having a high concentration impurity diffusion layer provided as a source diffusion layer in at least a part of a surface thereof; a column-shaped semiconductor layer provided on the semiconductor substrate perpendicularly to the semiconductor substrate, and having a drain diffusion layer provided in an uppermost portion thereof and a first low concentration impurity diffusion layer provided in an entire bottom portion thereof; a memory cell arrangement which includes a plurality of memory cells provided in a peripheral wall of the column-shaped semiconductor layer and connected in series perpendicularly to the substrate, the memory cells each having a charge storage layer and a control gate; a second impurity diffusion layer provided at a lower end of the memory cell arrangement; and a selection transistor having a gate electrode and connecting the second impurity diffusion layer and the first impurity diffusion layer.

In other words, the inventive memory cell unit is constructed such that the plurality of memory cells are connected in series perpendicularly to the surface of the semiconductor substrate and each have first and second electrically conductive layers respectively serving as the charge storage layer and the control gate. The memory cells are provided in the peripheral wall of each of column-shaped semiconductor layers arranged in a matrix configuration on the semiconductor substrate and isolated from each other by a lattice trench. The column-shaped semiconductor layers each have impurity diffusion layers provided at upper and lower ends thereof and respectively serving as a drain and a source. The column-shaped semiconductor layers are electrically isolated from the semiconductor substrate by the lower impurity diffusion layers.

The source diffusion layer may be formed in the entire surface of the semiconductor substrate, or may be formed in a part of the semiconductor substrate.

A third impurity diffusion layer may be provided between each two adjacent memory cells of the memory cell arrangement, and a distance between the first impurity diffusion layer and the second impurity diffusion layer disposed on opposite sides of a channel region provided in the column-shaped semiconductor layer in opposed relation to the gate electrode may be greater than a distance between the second impurity diffusion layer and the third impurity diffusion layer or between the third impurity diffusion layers disposed on opposite sides of a channel region of each of the memory cells.

With this arrangement, the selection transistor of the memory cell unit has a sufficient breakdown voltage. Therefore, when a writing operation is performed on a selected one of the memory cells, the channel potentials of the other unselected memory cells can assuredly be kept at a writing prevention voltage. As a result, erroneous writing to the unselected memory cells can assuredly be prevented. Thus, the memory cell unit is highly reliable and stably operable.

Figure 3:
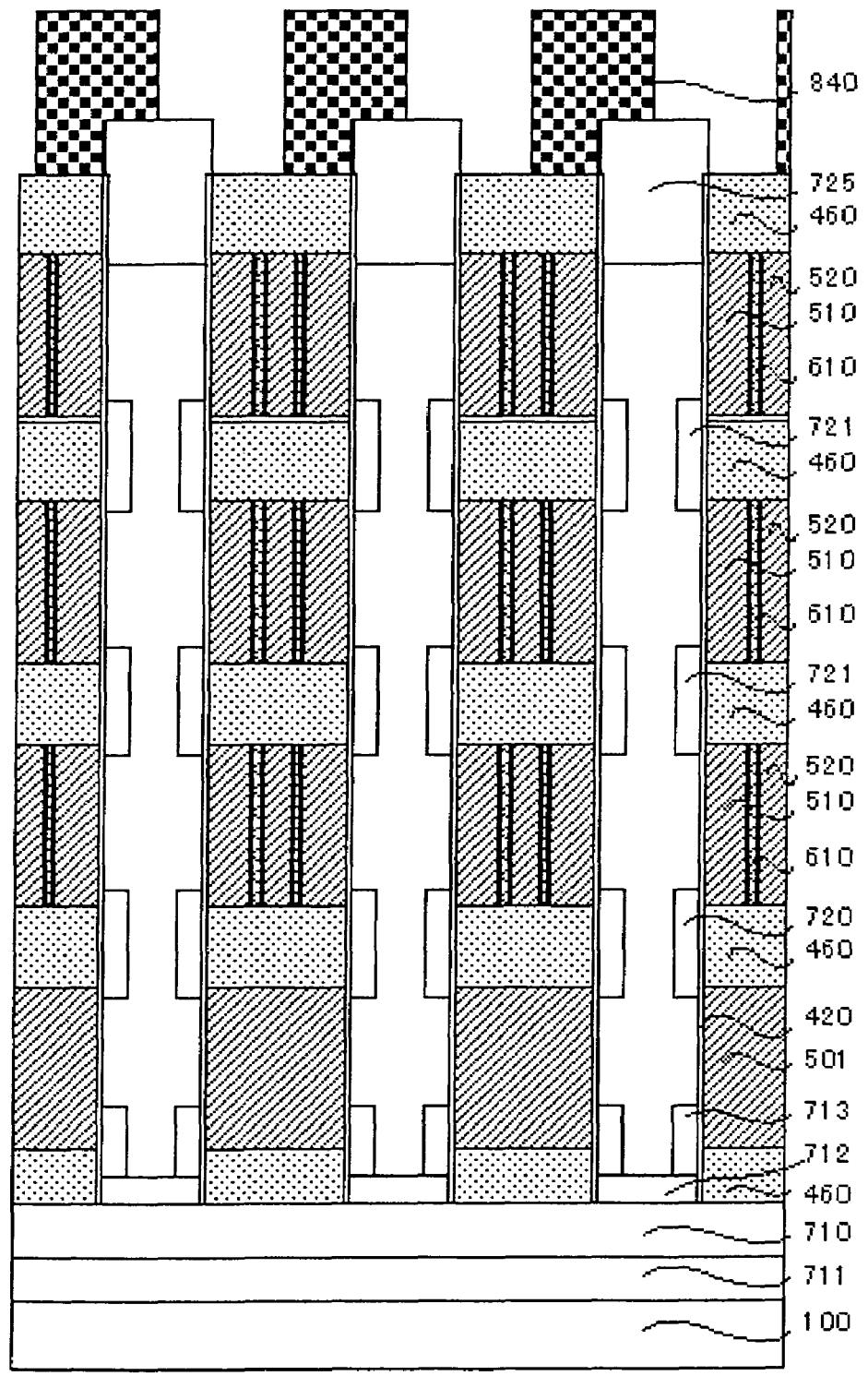
FIG. 3 is a sectional view of another example of the memory cell unit array taken along the line A-A' in FIG. 1 wherein three memory cell units each including three memory cells are arranged according to the first embodiment of the present invention.

Referring to FIG. 3, for example, the distance between the first impurity diffusion layer and the second impurity diffusion layer means a minimum distance between first impurity diffusion layers 712, 713 and a second impurity diffusion layer 720. The distance between the second impurity diffusion layer and the third impurity diffusion layer means a minimum distance between the second impurity diffusion layer 720 and a third impurity diffusion layer 721, and the distance between the third impurity diffusion layers means a minimum distance between third impurity diffusion layers 721 which are disposed on opposite sides of a channel region of an intermediate memory cell in FIG. 3.

A low concentration impurity diffusion layer may be provided below the source diffusion layer, and the source diffusion layer may contact the substrate with the intervention of the low concentration impurity diffusion layer.

With this arrangement, the parasitic capacitance of a source line is reduced. Therefore, rising/falling time is reduced when a source voltage is applied. Thus, the memory cell unit has a higher operating speed.

A plurality of memory cell units each having the aforesaid construction according to the present invention may be arranged longitudinally and transversely in a matrix configuration to provide a memory cell array. The memory cell array includes control gate lines extending parallel to the surface of the semiconductor substrate and each provided by sequentially connecting control gates of corresponding memory cells in memory cell units (column-shaped semiconductor layers) arranged longitudinally in each column of the matrix configuration, and bit lines extending parallel to the semiconductor substrate surface as crossing the control gate lines and electrically connected to impurity diffusion layers in memory cell units arranged transversely in each row of the matrix configuration.

A nonvolatile semiconductor device according to the present invention comprises a plurality of memory cell units arranged longitudinally and transversely in a matrix configuration, wherein the memory cell units each comprise the aforesaid memory cell unit.

With this arrangement, the memory cell units can assuredly prevent erroneous writing to unselected memory cells. Hence, the nonvolatile semiconductor device is highly reliable and stably operable.

The inventive nonvolatile semiconductor device may be produced by substantially the same production method as described in Japanese Unexamined Patent Publication No. 2002-57231. To provide the low concentration impurity diffusion layers in the bottom portions of the column-shaped semiconductor layers and in the channel regions of the selection transistors provided in the peripheral walls of the column-shaped semiconductor layers in the nonvolatile semiconductor device, a proper combination of conditions for impurity introduction and annealing is employed for forming the first impurity diffusion layers 712, 713 at desired positions by impurity diffusion in the step of forming the source diffusion layer of the selection transistor.

An inventive memory cell array driving method is adapted to perform a writing operation on a selected memory cell in a memory cell array which includes a plurality of memory cell units arranged longitudinally and transversely in a matrix configuration and control gate lines. The memory cell units each comprise a semiconductor substrate having a high concentration impurity diffusion layer provided as a source diffusion layer in at least a part of a surface thereof, a column-shaped semiconductor layer provided on the semiconductor substrate perpendicularly to the semiconductor substrate and having a drain diffusion layer provided in an uppermost portion thereof and a first low concentration impurity diffusion layer provided in an entire bottom portion thereof, the column-shaped semiconductor layer being electrically isolated from the semiconductor substrate, a memory cell arrangement which includes a plurality of memory cells provided in a peripheral wall of the column-shaped semiconductor layer and connected in series perpendicularly to the substrate, the memory cells each having a charge storage layer and a control gate, a second impurity diffusion layer provided at a lower end of the memory cell arrangement, and a selection transistor connecting the second impurity diffusion layer and the first impurity diffusion layer. The control gates of the memory cells in the memory cell units are connected commonly to the corresponding control gate lines.

The driving method comprises the steps of: applying a positive source voltage to the source diffusion layers of the respective memory cell units; applying a grounding voltage to a drain diffusion layer of a memory cell unit including the selected memory cell; applying a writing voltage to a control gate line connected to the selected memory cell; and applying a writing prevention voltage to drain diffusion layers of memory cell units not including the selected memory cell for prevention of writing to unselected memory cells which share the control gate line connected to the selected memory cell.

In the above-described driving method, the voltages excepting the writing voltages may be applied simultaneously or in time-staggered manner, but the writing voltage must be applied lastly.

The writing operation herein means injection of electrons to the charge storage layer of the selected memory cell.

The writing prevention voltage herein means a voltage to be applied to the drain diffusion layers of the unselected memory cell units in the writing to the selected memory cell. When electrons are injected into the charge storage layer of the selected memory cell for the writing, a positive voltage is applied as the writing voltage to the control gate line connected to the control gate of the selected memory cell. Since the writing voltage is also applied to the control gates of the unselected memory cells which share the control gate line connected to the selected memory cell, the writing to the unselected memory cells should be prevented. Therefore, a positive high voltage is applied to the drain diffusion layers of the memory cell units not including the selected memory cell, whereby the electron injection to the unselected memory cells is prevented by a voltage difference between the drain diffusion layers and the control gates. The voltage applied to the drain diffusion layers at this time is the writing prevention voltage.

Figure 19:
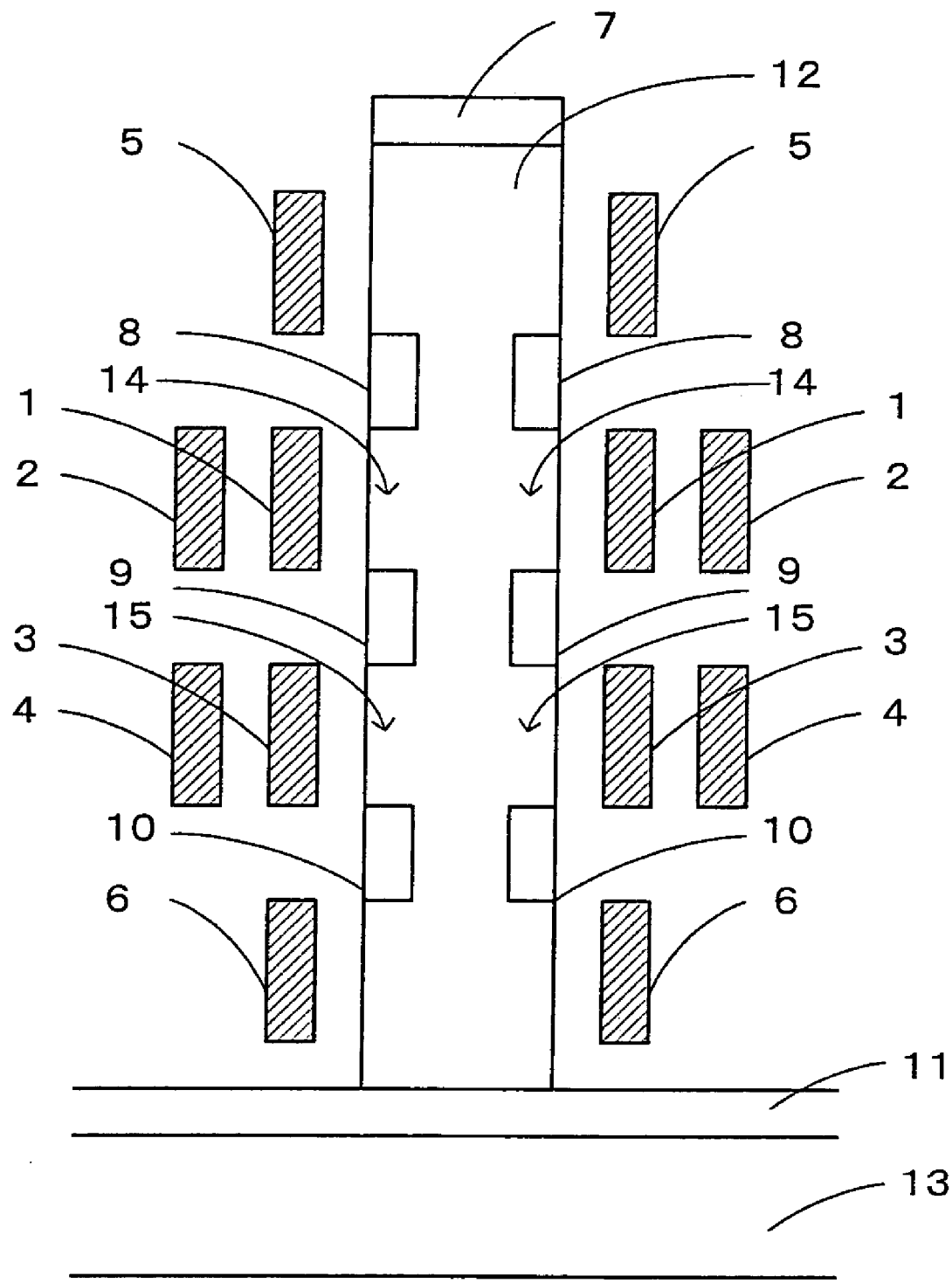
FIG. 19 is a sectional view illustrating another exemplary conventional nonvolatile semiconductor storage device.

The inventive driving method is applicable to a nonvolatile semiconductor storage device in which column-shaped semiconductor layers are isolated from a substrate as shown in FIG. 19. Particularly, the inventive driving method is preferably applied to nonvolatile semiconductor storage devices as shown in FIGS. 2 to 9 according to the present invention.

An inventive memory cell array driving method is adapted to perform a writing operation on a selected memory cell in a memory cell array which includes a plurality of memory cell units arranged longitudinally and transversely in a matrix configuration and control gate lines. The memory cell units each comprise a semiconductor substrate having a high concentration impurity diffusion layer provided as a source diffusion layer in a part of a surface thereof, a column-shaped semiconductor layer provided on the semiconductor substrate perpendicularly to the semiconductor substrate with a part of a bottom thereof being in contact with the source diffusion layer and with the other part of the bottom thereof being electrically connected to the semiconductor substrate, and having a drain diffusion layer provided in an uppermost portion thereof and a first low concentration impurity diffusion layer provided in an entire bottom portion thereof, a memory cell arrangement which includes a plurality of memory cells provided in a peripheral wall of the column-shaped semiconductor layer and connected in series perpendicularly to the substrate, the memory cells each having a charge storage layer and a control gate, a second impurity diffusion layer provided at a lower end of the memory cell arrangement, and a selection transistor connecting the second impurity diffusion layer and the first impurity diffusion layer. The control gates of the memory cells in the memory cell units are connected commonly to the corresponding control gate lines.

The driving method comprises the steps of: applying a positive source voltage to the source diffusion layers of the respective memory cell units; applying a grounding voltage to a drain diffusion layer of a memory cell unit including the selected memory cell; applying a writing voltage to a control gate line connected to the selected memory cell; and applying a writing prevention voltage to drain diffusion layers of memory cell units not including the selected memory cell for prevention of writing to unselected memory cells which share the control gate line connected to the selected memory cell.

In the above-described driving method, the voltages excepting the writing voltages may be applied simultaneously or in time-staggered manner, but the writing voltage must be applied lastly.

Figure 18:
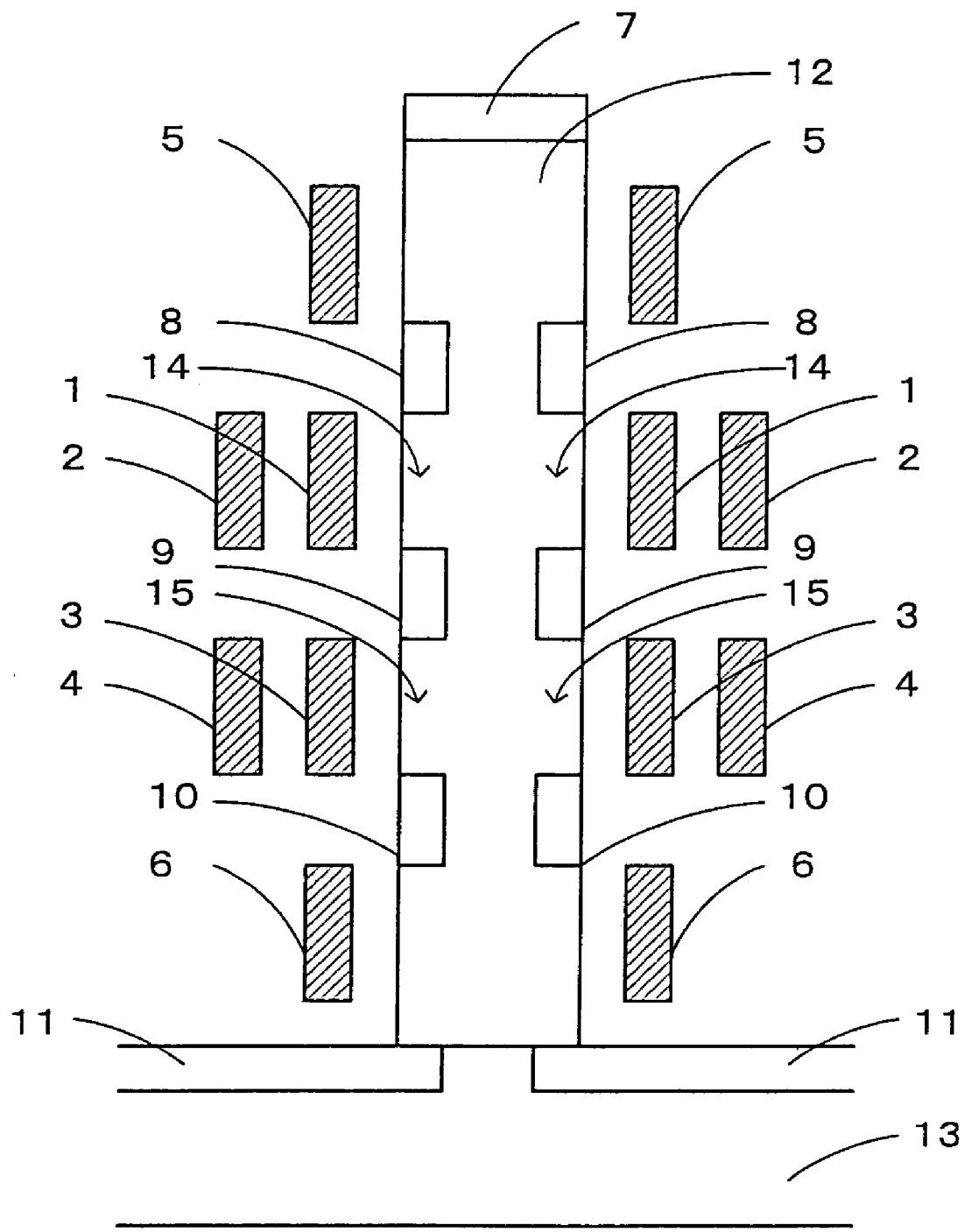
FIG. 18 is a sectional view illustrating an exemplary conventional nonvolatile semiconductor storage device.

This inventive driving method is applicable to a nonvolatile semiconductor storage device in which column-shaped semiconductor layers are electrically connected to a substrate as shown in FIG. 18.

The source voltage may be not higher than the writing prevention voltage. If the source voltage is not higher than the writing prevention voltage, the inter-channel voltage of the selection transistor of the memory cell unit including the selected memory cell is virtually equalized with the source voltage. Therefore, the erroneous writing can assuredly be prevented even if the selection transistor has a breakdown voltage not higher than the writing prevention voltage.

The breakdown voltage of the selection transistor may be not lower than one half the writing prevention voltage, and the source voltage may be one half the writing prevention voltage.

With this arrangement, the channel potentials of the memory cell units not including the selected memory cell are virtually equalized with the writing prevention voltage, and the source voltage is equal to one half the writing prevention voltage. Therefore, if the selection transistor has a breakdown voltage not lower than one half the writing prevention voltage, the channel potentials of the memory cell units not including the selected memory cell can be kept at not lower than the writing prevention voltage. Hence, erroneous writing to the unselected memory cells can assuredly be prevented. On the other hand, the channel potential of the memory cell unit including the selected memory cell is virtually equalized with the grounding voltage, and the source voltage is equal to one half the writing prevention voltage. Therefore, if the selection transistor has a breakdown voltage not lower than one half the writing prevention voltage, the source voltage can be stabilized, and the channel potentials of the memory cell units not including the selected memory cell is kept at not lower than the writing prevention voltage. Hence, erroneous writing to the unselected memory cells can assuredly be prevented.

DESCRIPTION OF THE PREFERRED EMBODIMENTS

With reference to the attached drawings, the construction of an inventive memory cell unit will hereinafter be described by way of embodiments.

First Embodiment

Figure 2:
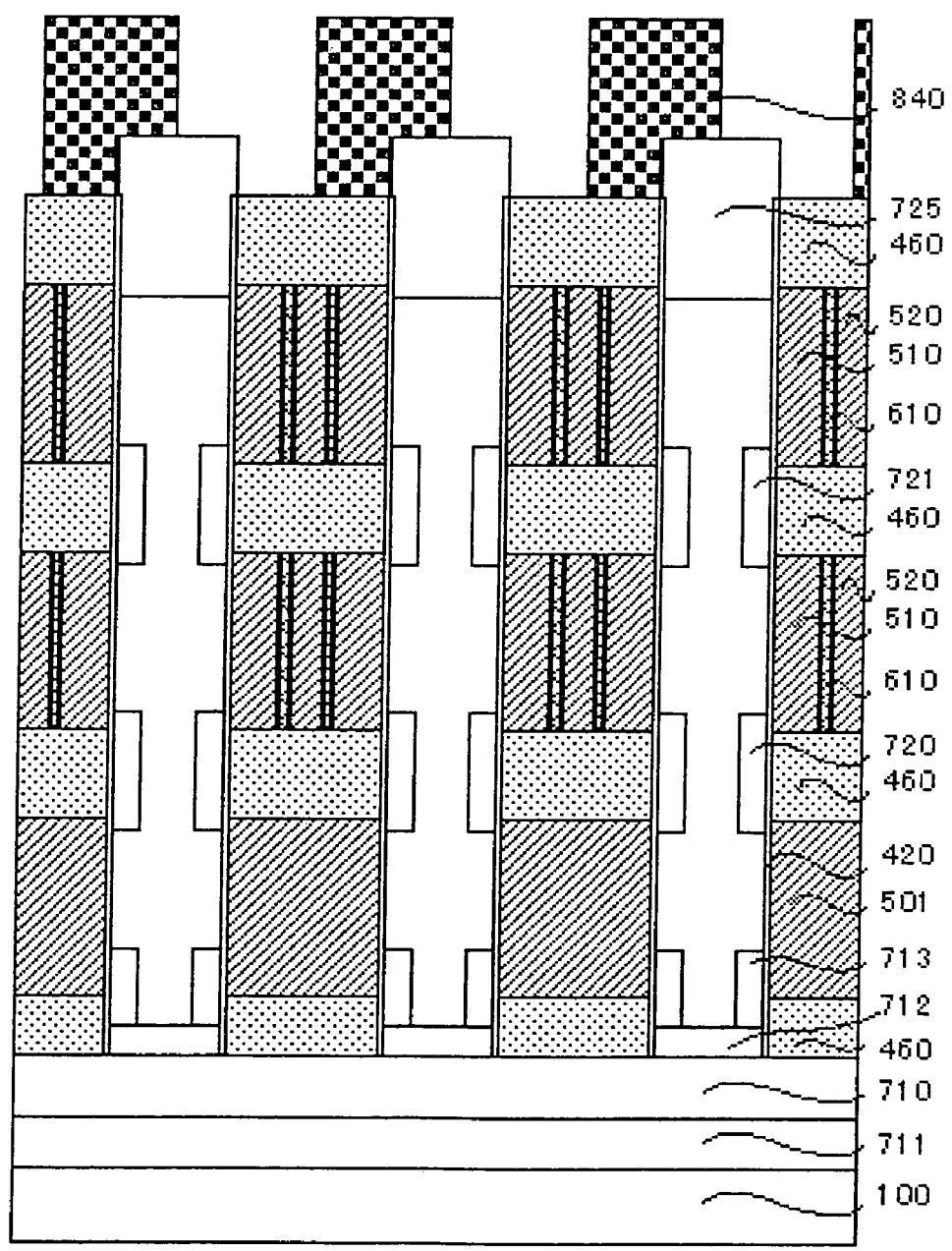
FIG. 2 is a sectional view of one example of the memory cell unit array taken along a line A-A' in FIG. 1 according to the first embodiment of the present invention.

FIG. 1 is a plan view of a memory cell unit array including memory cell units arranged in a matrix configuration according to a first embodiment. FIG. 2 is a sectional view of one example of the memory cell unit array taken along a line A-A' in FIG. 1. In this embodiment, the memory cell units are respectively provided in association with column-shaped semiconductor layers 110 arranged in a matrix configuration on a p-type silicon substrate 100. The memory cell units each include a selection transistor having a selection gate 501 provided on a lower portion of the column-shaped semiconductor layer 110, and two memory cell transistors provided above the selection transistor and connected in series along the column-shaped semiconductor layer. The number of the memory cells provided in each of the memory cell units is not limited to two, but it is merely necessary to provide plural memory cells in the memory cell unit. For example, three memory cells may be provided in each of the memory cell units as shown in a sectional view of FIG. 3 taken along the line A-A' in FIG. 1. A silicon oxide film 460 having a predetermined thickness is provided as an insulation film in a bottom portion of a trench provided between the column-shaped semiconductor layers. The selection gate 501 of the selection gate transistor is provided on a peripheral wall of the column-shaped semiconductor layer 110 with the intervention of a gate insulation film (silicon oxide film) 420 as surrounding the column-shaped semiconductor layer. The memory cells provided above the selection transistor each include a floating gate (charge storage layer) 510 provided around the column-shaped semiconductor layer 110 with the intervention of the insulation film 420, and a control gate 520 provided around the floating gate 510 with the intervention of an inter-layer insulation film 610 of a multi-layer structure. In FIGS. 2 and 3, the column-shaped semiconductor layers 110 are each electrically isolated from the silicon substrate 100 by a lower concentration impurity diffusion layer 712 provided in a bottom portion thereof and a source diffusion layer 710 provided in the entire surface of the silicon substrate 100.

In FIGS. 2 and 3, an impurity diffusion layer provided in contact with an upper portion of the source diffusion layer 710 to connect the source diffusion layer 710 and the source side selection transistor is constituted by the low concentration impurity diffusion layer 712 provided in the bottom portion of the column-shaped semiconductor layer 110 and a low concentration impurity diffusion layer 713 extending into a part of a channel region of the selection transistor provided in the column-shaped semiconductor layer 110 in opposed relation to the selection gate 501. As shown in FIGS. 2 and 3, the low concentration impurity diffusion layer 713 is preferably provided as overlapping with the source side selection transistor, and the low concentration impurity diffusion layer 712 is preferably provided so that the gate electrode 501 of the selection transistor is spaced a predetermined distance from the source diffusion layer (high concentration impurity diffusion layer) 710. Thus, the breakdown voltage of a junction between the source diffusion layer 710 and the column-shaped semiconductor layer 110 is increased.

Further, a lower portion of the source diffusion layer 710 preferably has an impurity concentration distribution such that the impurity concentration progressively decreases toward the inside of the semiconductor substrate 100 from the surface of the semiconductor substrate. That is, the breakdown voltage of a junction between the source diffusion layer 710 and the semiconductor substrate 100 is increased, and the parasitic capacitance of a source line constituted by the source diffusion layer 710 is reduced by providing the low concentration impurity diffusion layer in the lower portion of the source diffusion layer 710.

Figure 4:
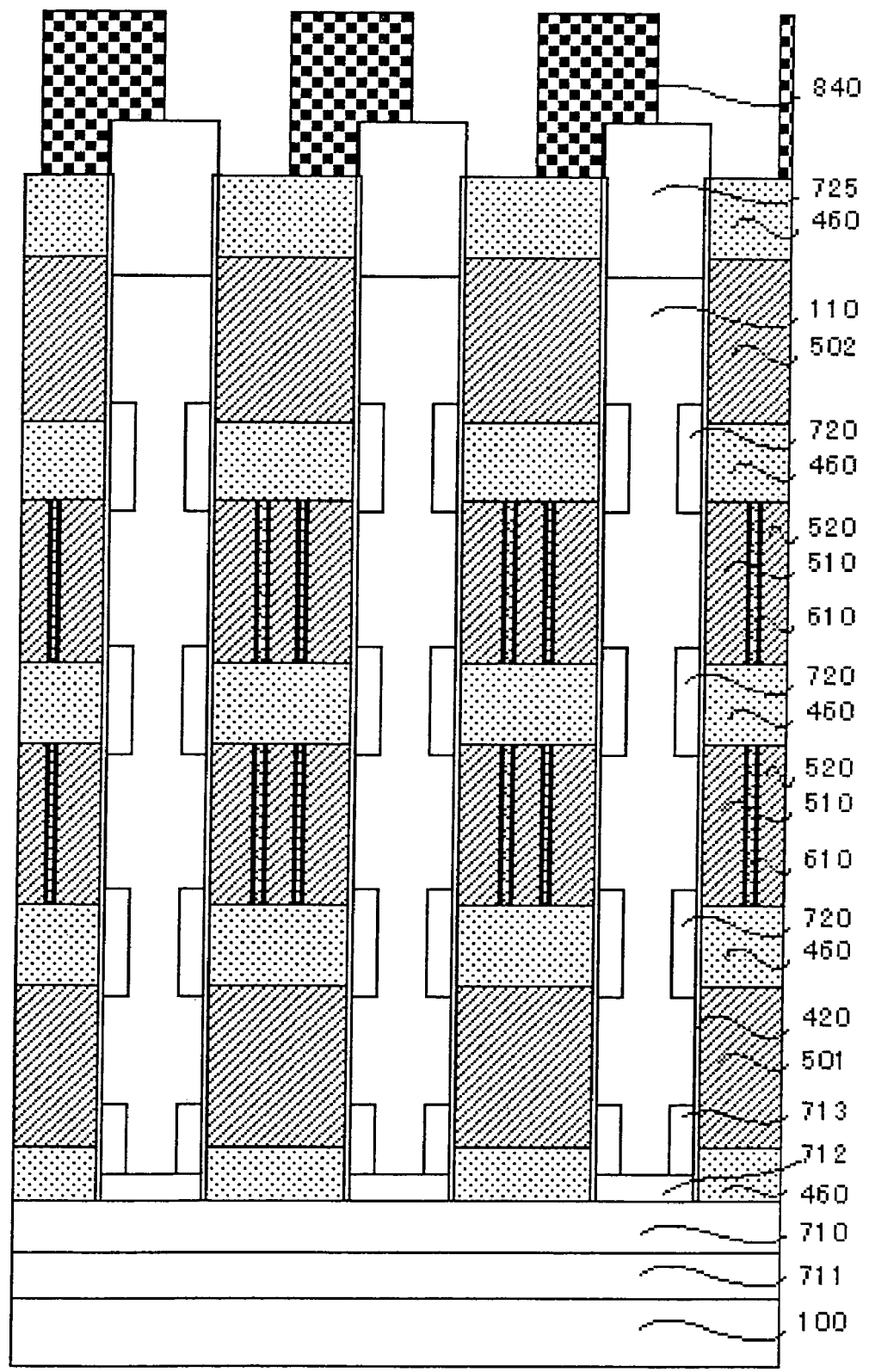
FIG. 4 is a sectional view of further another example of the memory cell unit array taken along the line A-A' in FIG. 1 wherein first and second selection transistors are provided above and below a memory cell arrangement according to the first embodiment of the present invention.
Figure 5:
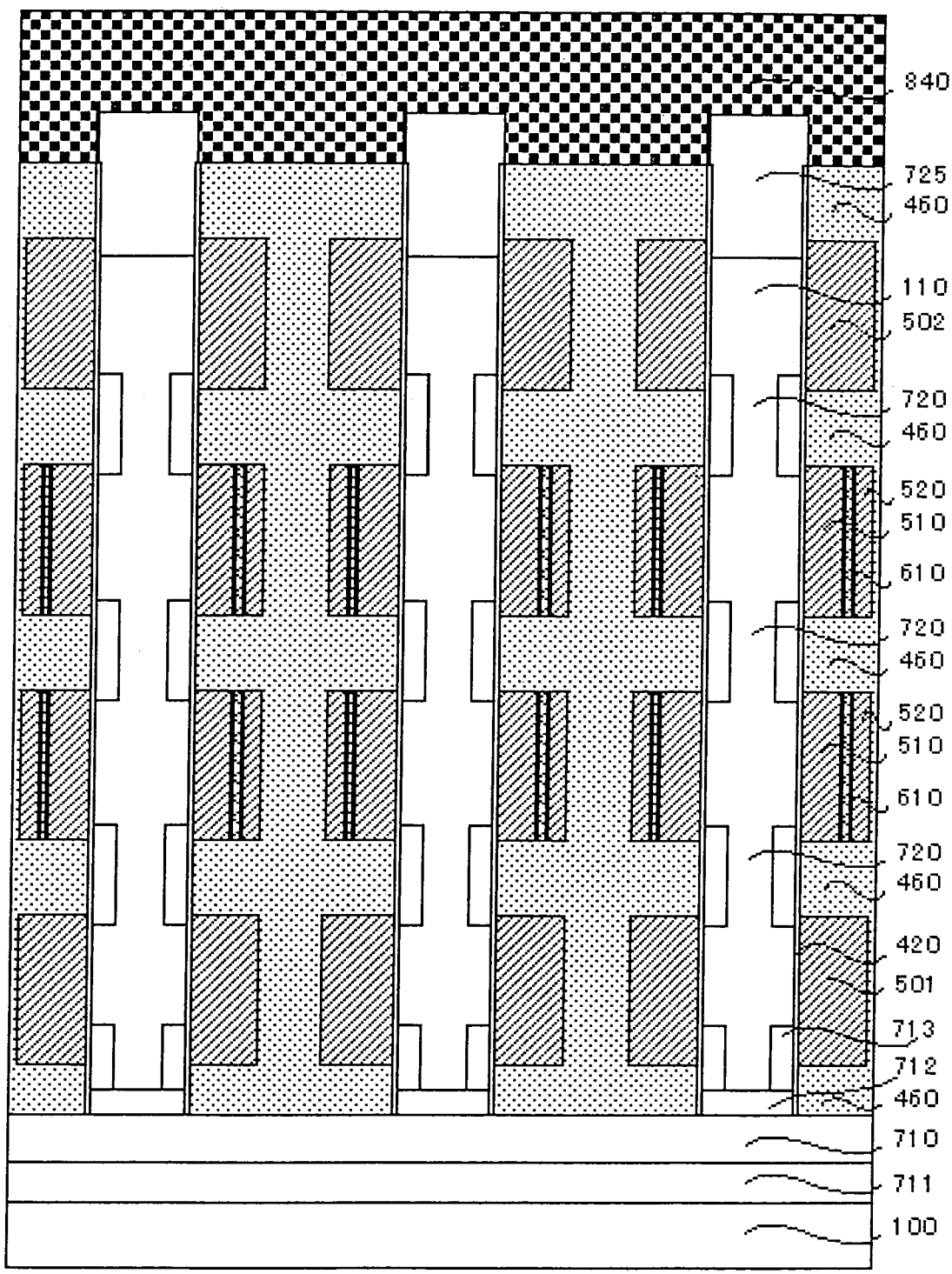
FIG. 5 is a sectional view of the further another example of the memory cell unit array taken along a line B-B' in FIG. 1 wherein the selection transistors are provided above and below the memory cell arrangement according to the first embodiment of the present invention.
Figure 6:
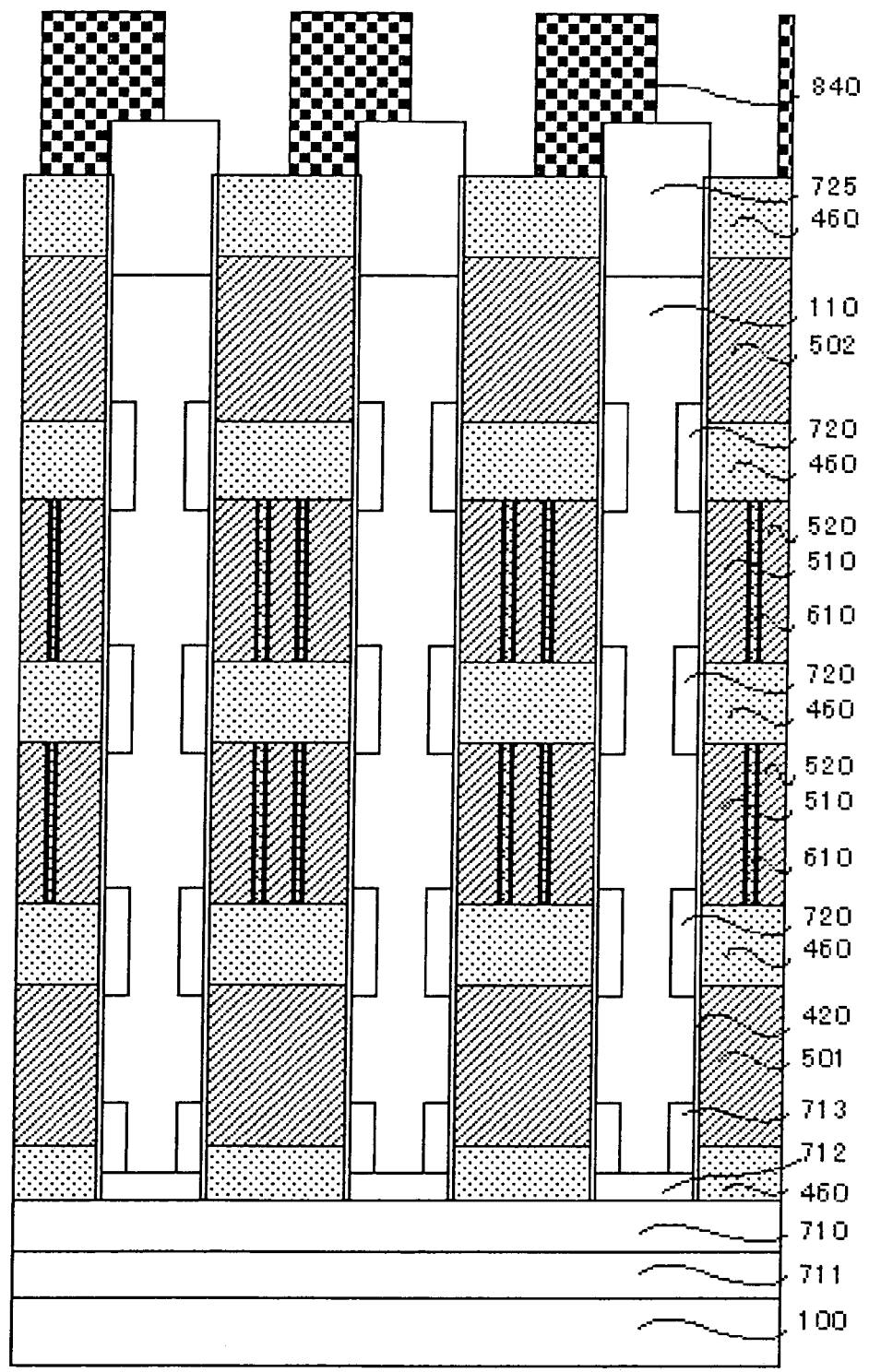
FIG. 6 is a sectional view of still another example of the memory cell unit array taken along the line A-A' in FIG. 1 wherein a plurality of source diffusion layers are provided in a substrate according to the first embodiment of the present invention.
Figure 7:
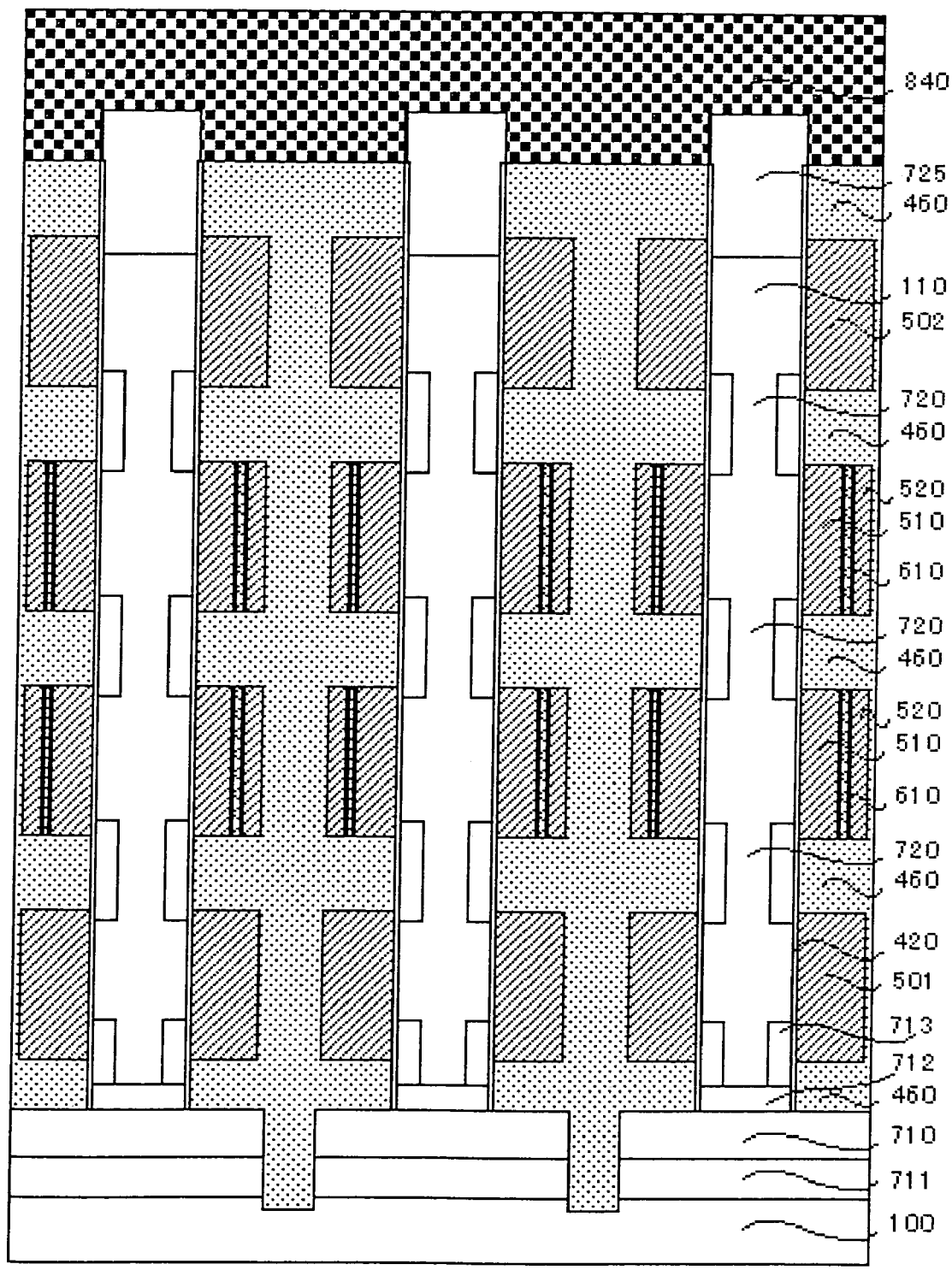
FIG. 7 is a sectional view of the still another example of the memory cell unit array taken along the line B-B' in FIG. 1 wherein the plurality of source diffusion layers are provided in the substrate according to the first embodiment of the present invention.

FIGS. 4 and 5 are sectional views illustrating another example of the memory cell unit array taken along the lines A-A' and B-B', respectively, in FIG. 1. The memory cell units each include first and second selection transistors respectively provided in upper and lower portions. The first selection transistor has a second electrode (first selection gate) 501, and the second selection transistor has a fifth electrode (second selection gate) 502. The memory cell units each further include two memory cell transistors arranged between the first and second transistors and connected in series along the column-shaped semiconductor layer. That is, the second selection gate 502 of the second selection transistor is disposed above the arrangement of the memory cells. In FIGS. 4 and 5, the column-shaped semiconductor layers 110 are each electrically isolated from the silicon substrate 100 by a low concentration impurity diffusion layer 712 provided in a bottom portion thereof and a source diffusion layer 710. FIGS. 6 and 7, which respectively correspond to FIGS. 4 and 5, illustrate further another example of the memory cell unit array wherein a plurality of source diffusion layers 710 are provided in surface portions of a silicon substrate 100 and each connected commonly to memory cell units arranged along the line A-A'. The number of the memory cells provided in each of the memory cell units is not limited to two, but it is merely necessary to provide plural memory cells in the memory cell unit.

As shown in FIGS. 1, 5 and 7, the first selection gates 501 in different memory cell units serially arranged in one direction are sequentially connected to one another to provide a lower selection gate line. Similarly, the second selection gates 502 in the different memory cell units serially arranged are sequentially connected to one another to provide an upper selection gate line, and the control gates 520 in the different memory cell units serially arranged are sequentially connected to one another to provide control gate lines. The source diffusion layer 710 and the low concentration impurity diffusion layer 711 for each of the memory cell units are provided in the semiconductor substrate surface so that the column-shaped semiconductor layer 110 (serving as an active region of the memory cell unit) is floated from the semiconductor substrate 100. The memory cell units each further include low concentration impurity layers 720 provided in series in the column-shaped semiconductor layer 110 between the memory cells and between the memory cells and the selection transistors, and a drain diffusion layer 725 provided in an upper surface of the column-shaped semiconductor layer 110. Oxide films 460 are provided as insulation films between the memory cell units so as to expose upper portions of the drain diffusion layers 725. An Al line 840 is provided as a bit line which commonly connects the drain diffusion layers 725 of the memory cell units serially arranged as crossing the control gate lines.

Figure 8:
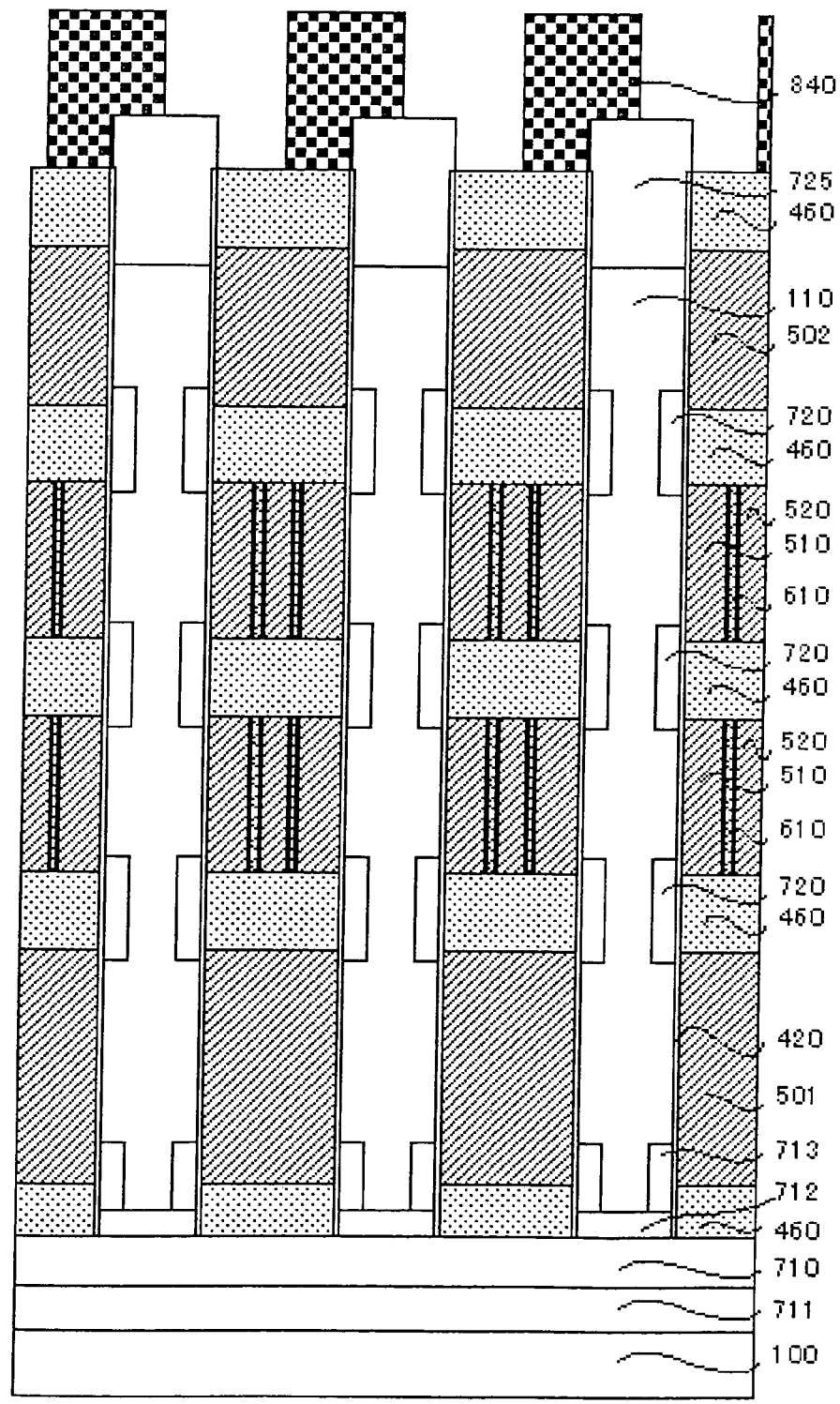
FIG. 8 is a sectional view of further another example of the memory cell unit array taken along the line A-A' in FIG. 1 wherein the channel length of a source side selection transistor is greater than the channel length of each memory cell according to the first embodiment of the present invention.
Figure 9:
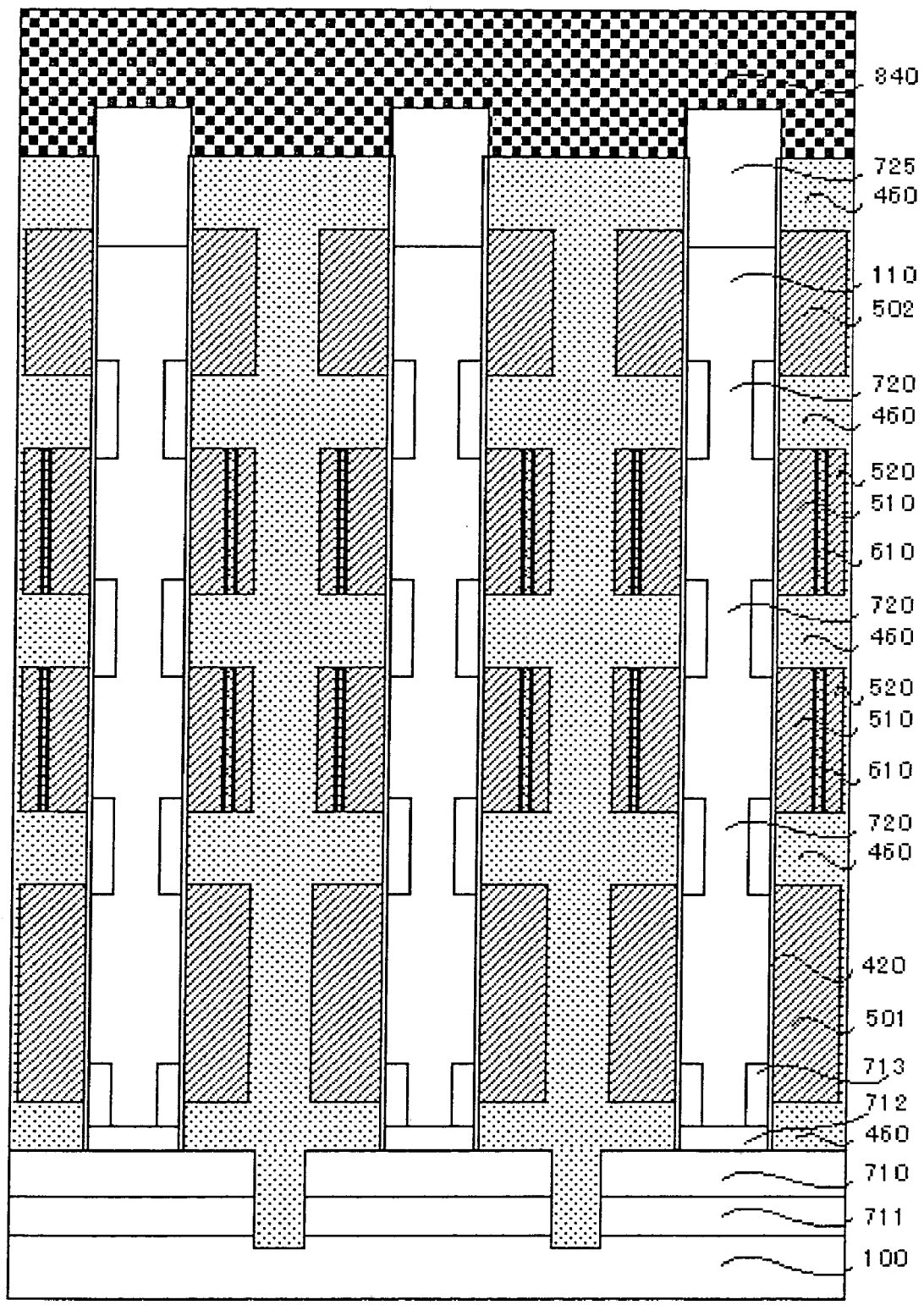
FIG. 9 is a sectional view of the further another example of the memory cell unit array taken along the line B-B' in FIG. 1 wherein the channel length of the source side selection transistor is greater than the channel length of the memory cell according to the first embodiment of the present invention.

Further, the source side selection transistor of the memory cell unit may have a channel length which is at least greater than the channel length of the memory cell transistor as shown in FIGS. 8 and 9. In this case, the punch-through breakdown voltage can be increased.

The plan configuration of the memory cell unit array according to the present invention will be described in greater detail. It is herein assumed that the memory cell unit array has a vertical configuration as shown in FIGS. 6 and 7. In the memory cell unit array shown in FIG. 1, the cylindrical column-shaped semiconductor layers are respectively disposed at intersections between parallel lines extending in a first direction and parallel lines extending in a second direction perpendicular to the first direction. The source diffusion layers (for example, indicated by a reference numeral 710 in FIGS. 6 and 7), the control gate lines (for example, indicated by a reference numeral 520 in FIGS. 6 and 7) and the selection gate lines (for example, indicated by reference numerals 501, 502 in FIGS. 6 and 7) for selecting and controlling the memory cells are disposed parallel to the surface of the semiconductor substrate. A distance between each two adjacent column-shaped semiconductor layers arranged along the line A-A' crossing the bit lines 840 and a distance between each two adjacent column-shaped semiconductor layers arranged along the line B-B' extending parallel to the bit lines 840 are set different from each other. Thus, control gates 520 of memory cells in memory cell units serially arranged in one direction (for example, in a direction A-A' in FIG. 1) are sequentially connected to one another to provide control gate lines. Similarly, selection gates 501 (502) of selection gate transistors in memory cell units serially arranged in the direction A-A' are sequentially connected to one another to provide a selection gate line. Further, terminals respectively electrically connected to the source diffusion layers 710 provided in the semiconductor substrate surface are disposed at A'-side ends of linear memory cell unit arrangements extending in the direction A-A', and terminals respectively electrically connected to the lower and upper selection gate lines (lower and upper selection gates 501, 502) and the lower and upper control gate lines (control gates 520) are disposed at A-side ends of the memory cell unit arrangements. The bit lines 840 provided over the column-shaped semiconductor layers are each electrically connected to drain diffusion layers 725 of memory cell units (cylindrical column-shaped semiconductor layers) arranged as crossing the control gate lines and the selection gate lines. The terminals electrically connected to the source diffusion layers 710 are each provided in a column-shaped semiconductor layer of the same type as that of the memory cell unit. The terminals electrically connected to the lower and upper selection gate lines 501, 502 and the lower and upper control gate lines 520 are formed by coating a peripheral wall of a column-shaped semiconductor layer of a different type with electrically conductive films in a control gate line formation step. The terminals respectively electrically connected to the source diffusion layers 710, the lower selection gate lines 501, the upper selection gate lines 502 and the lower and upper control gate lines 520 are respectively connected to first contacts 910, second contacts 921 and 924 and third contacts 932 and 933. In FIG. 1, source terminal lines 810 respectively connected to the source diffusion layers 710 via the first contacts 910 extend to an upper surface of the semiconductor storage device.

While this embodiment has been described by way of examples, the arrangement of the cylindrical column-shaped semiconductor layers of the memory cell units is not limited to that shown in FIG. 1. The arrangement of the column-shaped semiconductor layers may be modified, as long as the positional relationship and electrical connection of the interconnection layers are equivalent to those of the aforesaid embodiment. In FIG. 1, the column-shaped semiconductor layers 110 connected to the first contacts 910 are disposed at the A'-side ends of the respective memory cell unit arrangements each extending in the direction A-A', but may be disposed at A-side ends of some or all of the memory cell unit arrangements. Alternatively, the terminals connected to the first contacts 910 may each be disposed at any one of column-shaped semiconductor layers arranged in the direction A-A' crossing the bit lines 840. The column-shaped semiconductor layers each coated with the electrically conductive films respectively connected to the second contacts 921, 924 and the third contacts 932, 933 are disposed at ends of the memory cell unit arrangements opposite from the column-shaped semiconductor layers connected to the first contacts 910, but may be disposed adjacent to the column-shaped semiconductor layers connected to the first contacts 910. Alternatively, the terminals connected to the second contacts 921, 924 and the third contacts 932, 933 may each be disposed at any one of the column-shaped semiconductor layers arranged in the direction A-A' crossing the bit lines 840, or may be disposed separately at the column-shaped semiconductor layers. The widths and configurations of the source terminal lines 810 and the bit lines 840 are not particularly limited, as long as the source terminal lines 810 and the bit lines 840 can be provided as desired.

Where the source diffusion layers 710 are simultaneously formed in the substrate surface adjacent to the column-shaped semiconductor layers in self-alignment with the control gates and the selection gates, the column-shaped semiconductor layers provided with the source terminals are electrically isolated from the selection gates 501, 502 and the control gates 520, but contact the selection gates 501, 502 and the control gates 520 with the intervention of insulation films. In FIG. 1, first electrically conductive films, which are formed simultaneously with the charge storage layers, are respectively provided on side surface portions of the column-shaped semiconductor layers connected to the first contacts 910 with the intervention of the insulation films. The first electrically conductive films are disposed between the column-shaped semiconductor layers connected to the first contacts 910 and the column-shaped semiconductor layers provided with the memory cell units. Second electrically conductive films, which are formed simultaneously with the control gates 520, are respectively provided on the first electrically conductive films with the intervention of insulation films. The second electrically conductive films are respectively connected to the selection gate lines 501, 502 and the control gate lines 520 each extending in the direction A-A' crossing the bit lines 840. The first and second electrically conductive films provided on the side surfaces of the column-shaped semiconductor layers may each have any configuration. A distance between the column-shaped semiconductor layer provided with the terminal electrically connected to the source diffusion layer and the charge storage layers on the column-shaped semiconductor layer provided with the memory cell unit may be not greater than twice the thickness of the control gates. In this case, the first electrically conductive films on the side surfaces of the column-shaped semiconductor layers provided with the terminals connected to the source diffusion layers 710 may entirely be omitted. In FIG. 1, the second contacts 921, 924 and the third contacts 932 are respectively provided on second electrically conductive films 521 to 524 covering the top of the column-shaped semiconductor layer. Interconnection layers connected to the second and third contacts may each have any configuration, as long as the connection to the second and third contacts can properly be achieved. It is noted that the selection gate transistors are not shown in FIG. 1 for simplicity.

Second Embodiment

Figure 10:
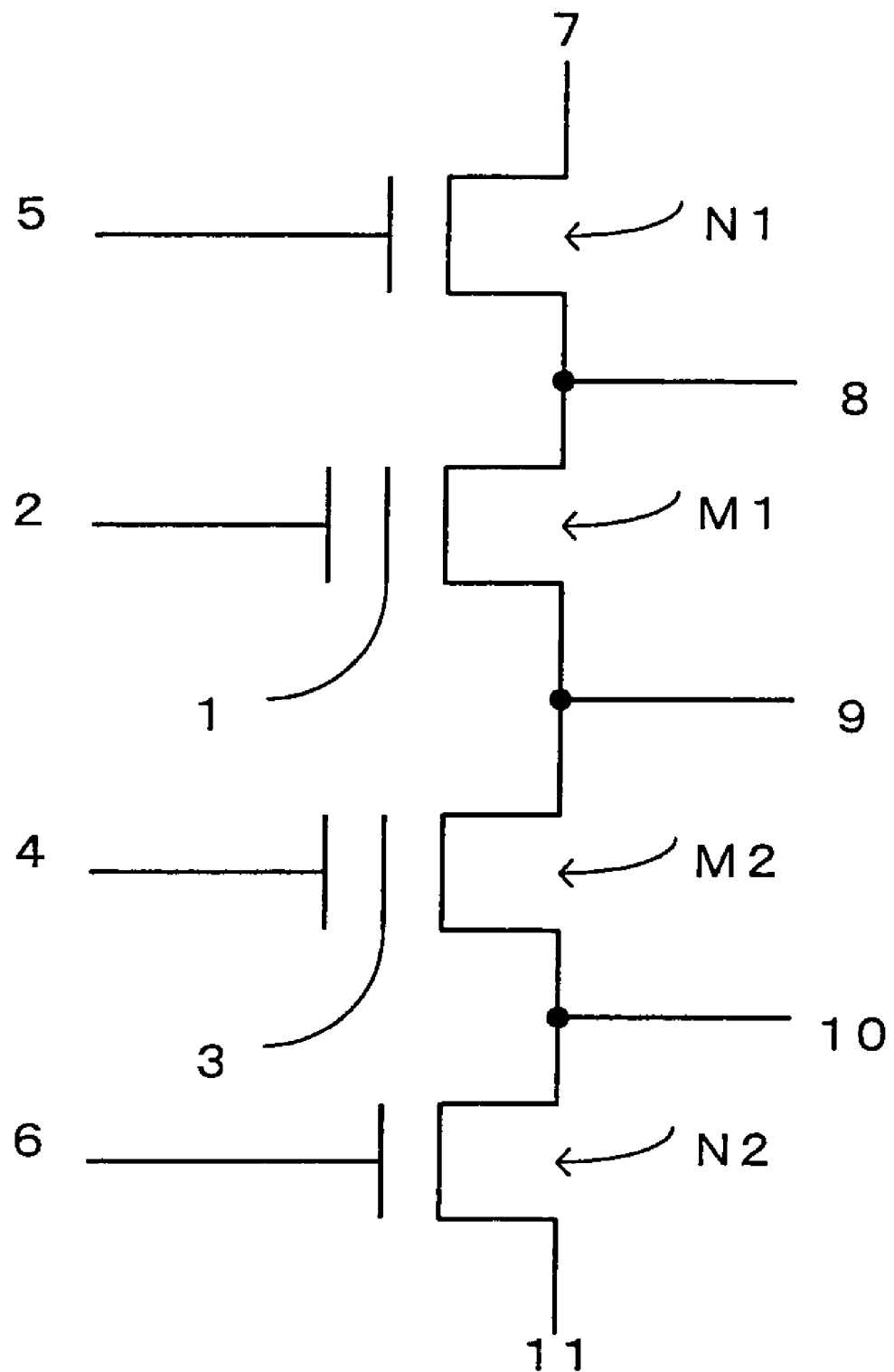
FIG. 10 is an equivalent circuit diagram of a memory cell unit to which a driving method according to a second embodiment of the present invention is applicable.
Figure 11:
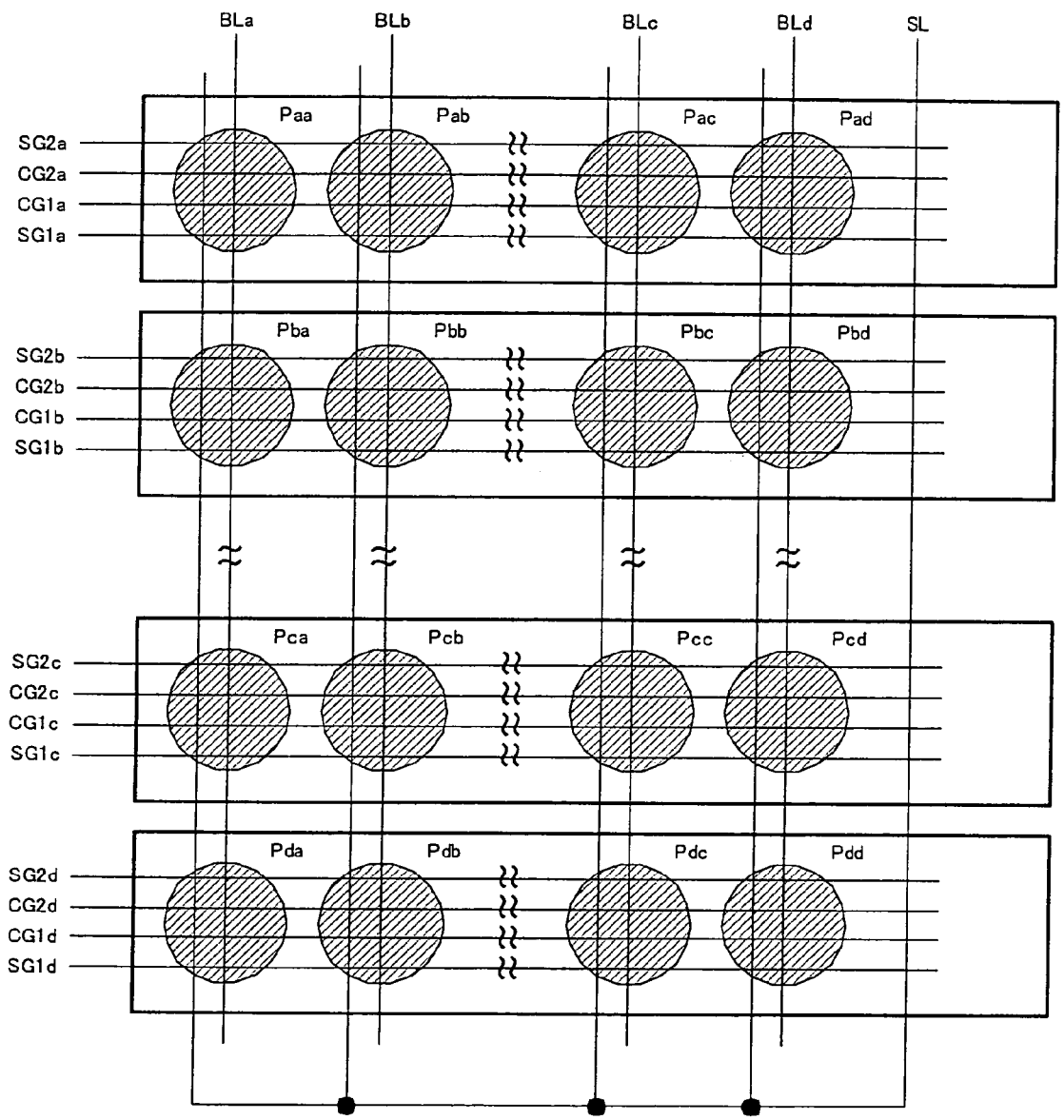
FIG. 11 is a block diagram of a memory cell unit array including a plurality of nonvolatile semiconductor devices arranged in a matrix configuration according to the second embodiment of the present invention.
Figure 12:
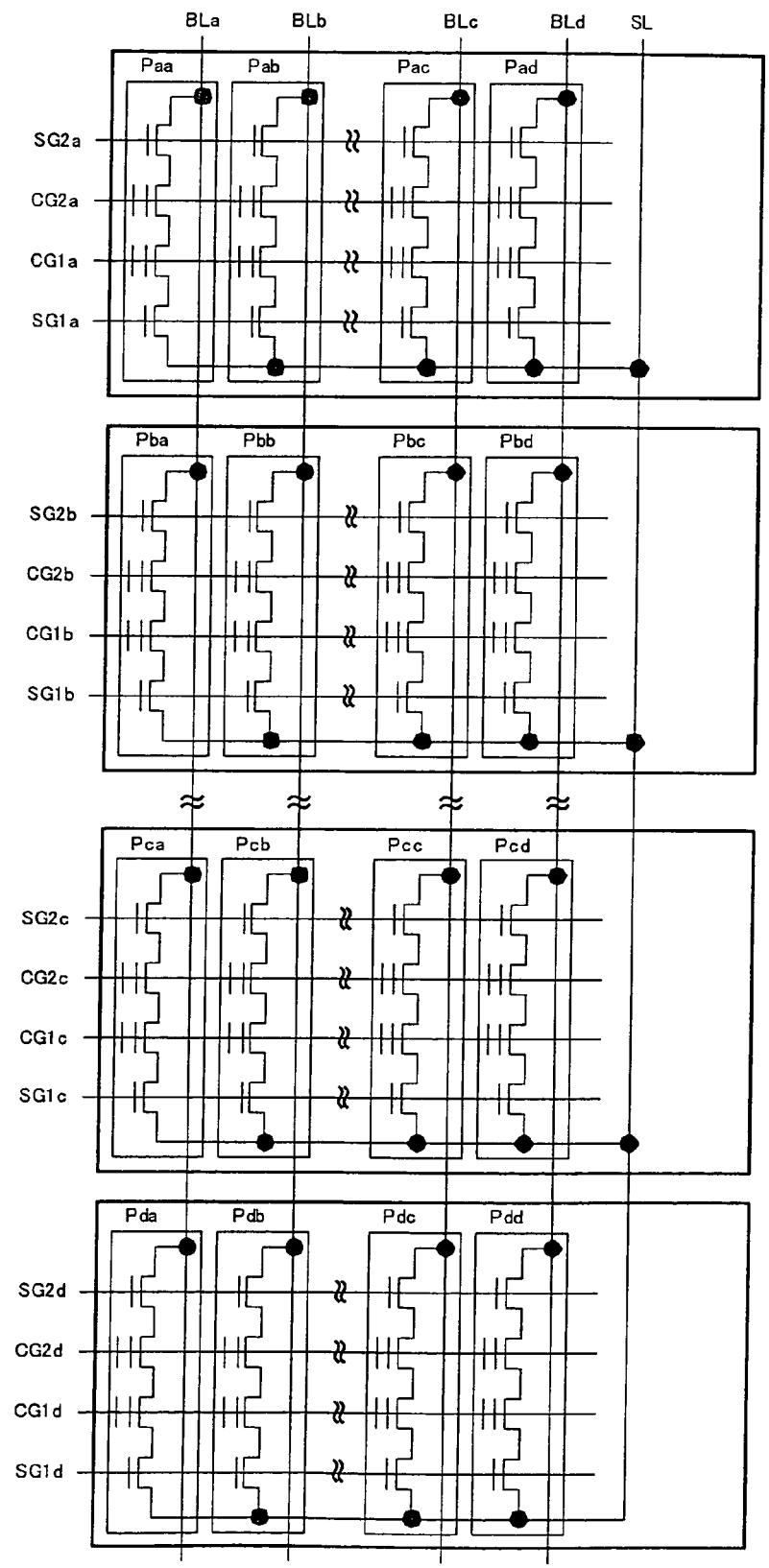
FIG. 12 is an equivalent circuit diagram of the memory cell unit array according to the second embodiment of the present invention.

An explanation will hereinafter be given to a memory cell array driving method according to the present invention. FIG. 10 is an equivalent circuit diagram of a memory cell unit to be driven by the driving method according to a second embodiment. The memory cell unit of FIG. 10 is an exemplary flash memory of a NAND memory cell type, which includes one or more memory cells (two memory cells M1, M2 in this embodiment) and two selection transistors N1, N2. FIG. 11 is a block diagram illustrating a memory cell unit array including a plurality of such NAND memory cell type flash memories arranged in a matrix configuration. FIG. 12 is an equivalent circuit diagram of the memory cell unit array.

As shown in FIGS. 11 and 12, the memory cell unit array includes NAND memory cell units Paa, Pab to Pac, Pad to be selected by selection gate lines $SG1_a$, $SG2a$ and control gate lines $CG1a$, $CG2a$, NADN memory cell units Pba, Pbb to Pbc, Pbd to be selected by selection gate lines $SG1b$, $SG2b$ and control gate lines $CG1b$, $CG2b$, NAND memory cell units Pca, Pcb to Pcc, Pcd to be selected by selection gate lines $SG1c$, $SG2c$ and control gate lines $CG1c$, $CG2c$, and NAND memory cell units to be selected by selection gate lines $SG1d$, $SG2d$ and control gate lines $CG1d$, $CG2d$.

Further, there are provided bit lines BLa to BLd and a common source line SL crossing the selection gate lines and the control gate lines. The NAND memory cell units Paa to Pdd each have the construction shown in FIG. 10, and each include two memory cells and two selection transistors disposed on opposite sides of the arrangement of the memory cells.

Writing Operation

An explanation will hereinafter be given to a driving method for writing to a memory cell in the memory cell unit array. It is herein assumed that the selection gate lines $SG1a$, $SG2a$ and the control gate lines $CG1a$, $CG2a$ are selected, and the other selection gate lines $SG1b$, $SG2b$, $SG1c$, $SG2c$, $SG1d$, $SG2d$ and the other control gate lines $CG1b$, $CG2b$, $CG1c$, $CG2c$, $CG1d$, $CG2d$ are unselected.

Where electrons are to be injected into a charge storage layer 1 of an upper memory cell M1 of any one of the selected memory cell units by an FN tunnel current for the writing, a high voltage VH1 is applied to the control gate line $CG2a$ (control gate 2), and a voltage VH2 (VH1>VH2) such as to prevent the writing is applied to the control gate line CG1*a* (control gate 4). A positive voltage VH3 is applied to the selection gate line SG2*a* (selection gate 5), and the selection gate line SG1*a* (selection gate 6) is set at 0V. A voltage VH4 which is one half a writing prevention voltage VH5 to be applied to bit lines is applied to the source line SL (source terminal 11), and a bit line (drain terminal 7) of the memory cell unit subjected to the electron injection is grounded.

The writing to memory cells not subjected to the electron injection in the selected memory cell units is prevented by applying the bit line writing prevention voltage VH5 to bit lines of these memory cell units.

The aforesaid voltages are thus applied to the respective terminals with the writing bit line (drain terminal 7) being grounded, whereby N-type impurity diffusion layers 8, 9, 10 are kept at a grounding potential. As a result, the floating channel is kept at the grounding potential, so that a potential difference which is equivalent to a difference between the high voltage VH1 and the grounding potential occurs between the control gate 2 and the floating channel. At this time, electrons are injected into the charge storage layer 1 from the floating channel by a tunnel current. The threshold voltage of the memory cell M1 is positively shifted by the electron injection. Since a source potential is kept at the voltage VH4 (=½·VH5), a potential difference VH4 (=½·VH5) occurs between the floating channel and the source terminal 11. However, a breakdown phenomenon due to an insufficient breakdown voltage is prevented, because the selection gate 6 has a breakdown voltage not lower than the voltage VH4.

On the other hand, the control gate line CG1*a* (control gate 4) is kept at the voltage VH2 (VH1>VH2) such as to prevent the writing, so that electron injection to the charge storage layer of the memory cell M2 is prevented. Hence, the threshold voltage of the memory cell M2 is kept unchanged.

Where electrons are injected into the charge storage layer 3 of the lower memory cell M2 of any one of the selected memory cell units, a high voltage VH1 is applied to the control gate line CG1*a* (control gate 4), and a voltage VH2 (VH1>VH2) such as to prevent the writing is applied to the control gate line CG2*a* (control gate 2). A positive voltage VH3 is applied to the selection gate line SG2*a* (selection gate 5), and a voltage VH4 which is one half the writing prevention voltage VH5 to be applied to bit lines is applied to the selection gate line SG1*a* (selection gate 6) and the source line SL (source terminal 11). A bit line (drain terminal 7) of the memory cell unit to be subjected to the electron injection is grounded.

The writing to memory cells not subjected to the electron injection in the selected memory cell units is prevented by applying the bit line writing prevention voltage VH5 to bit lines of these memory cell units. With the writing bit line (drain terminal 7) being grounded, the N-type impurity diffusion layers 8, 9, 10 are kept at a grounding potential. Then, the floating channel is kept at the grounding potential, so that a potential difference which is equivalent to a difference between the high voltage VH1 and the grounding potential occurs between the control gate 4 and the floating channel. At this time, electrons are injected into the charge storage layer 3 from the floating channel by a tunnel current. The threshold voltage of the memory cell M2 is positively shifted by the electron injection. At this time, a potential difference which is equivalent to the voltage VH4 occurs between the floating channel and the source terminal 11. However, a breakdown phenomenon due to an insufficient breakdown voltage is prevented, because the selection gate 6 has a breakdown voltage not lower than the voltage VH4.

On the other hand, the control gate line CG2*a* (control gate 2) is kept at the voltage VH2 (VH1>VH2) such as to prevent the writing, so that electron injection to the charge storage layer of the memory cell M1 is prevented. Hence, the threshold voltage of the memory cell M1 is kept unchanged.

Figure 13:
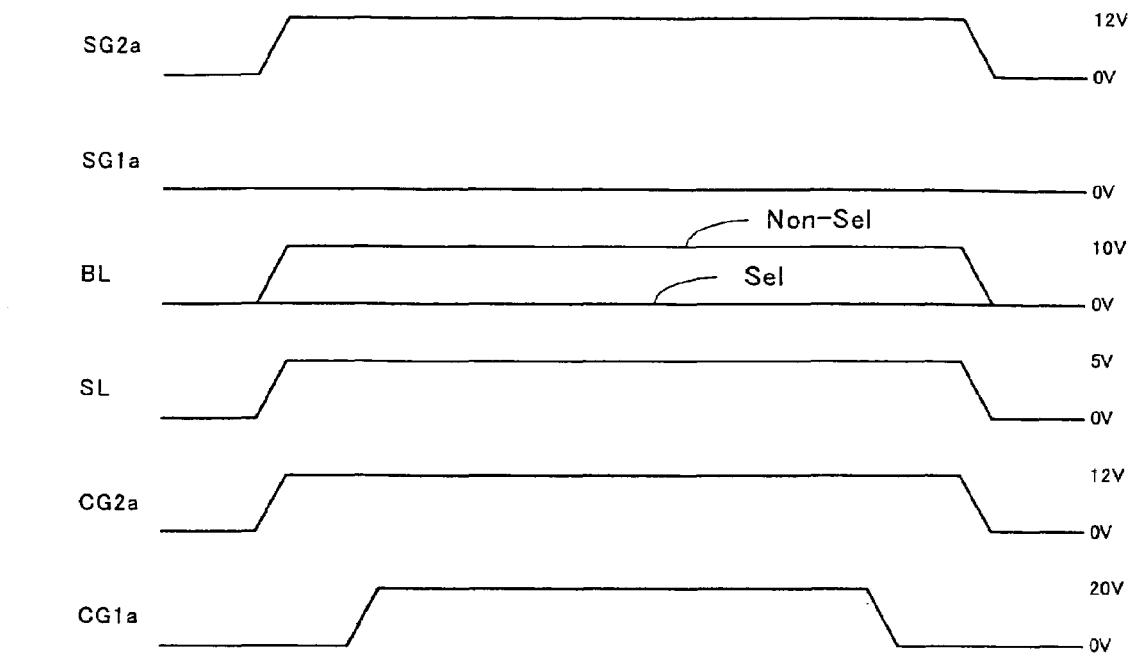
FIG. 13 is a timing chart for application of voltages in a writing operation according to the second embodiment of the present invention.

FIG. 13 is an exemplary timing chart for the application of the respective voltages for the writing operation according to this embodiment.

When the writing operation is performed on the memory cell M2 connected to the control gate line CG1*a*, the control gate lines CG1*a*, CG2*a*, the selection gate lines SG2*a*, SG1*a*, the source line SL and the bit line are set at 0V. With the bit line kept at 0V (as indicated by a reference character Sel in FIG. 13), 5V, 12V, 0V and 12V are applied to the source line SL, the selection gate line SG2*a*, the selection gate line SG1*a* and the control gate line CG2*a*, respectively, and then 20V is applied to the control gate line CG1*a*.

When the memory cell M2 is not subjected to the writing operation, 10V is applied to the bit line for prevention of the writing (as indicated by a reference character Non-Sel in FIG. 13). When the writing operation is finished, 0V is applied to the control gate line CG1*a* and then to the control gate line CG2*a*. Thereafter, 0V is applied to the selection gate lines SG2*a*, SG1*a*, the bit line and the source line. In FIG. 13, the voltages applied to the selection gate lines, the bit line and the source line are simultaneously changed. However, these voltages are not necessarily required to be simultaneously changed, but may be changed in a time-staggered manner.

Erasing Operation

An explanation will be given to a driving method for releasing electrons from charge storage layers of the memory cells M1, M2 of the selected memory cell units. A positive voltage VH1 is applied to the selection gate lines SG1*a*, SG2*a*, and the bit lines BL and the source line SL are grounded. Thereafter, a negative voltage VN1 is applied to the control gate lines CG1*a*, CG2*a*. Thus, a potential difference which is equivalent to a difference between the negative voltage VN1 and the grounding potential occurs between the control gates 2, 4 and the floating channels. At this time, electrons are released from the charge storage layers 1, 3 into floating channels by a tunnel current. The threshold voltages of the memory cells M1, M2 are negatively shifted by the release of the electrons.

Figure 14:
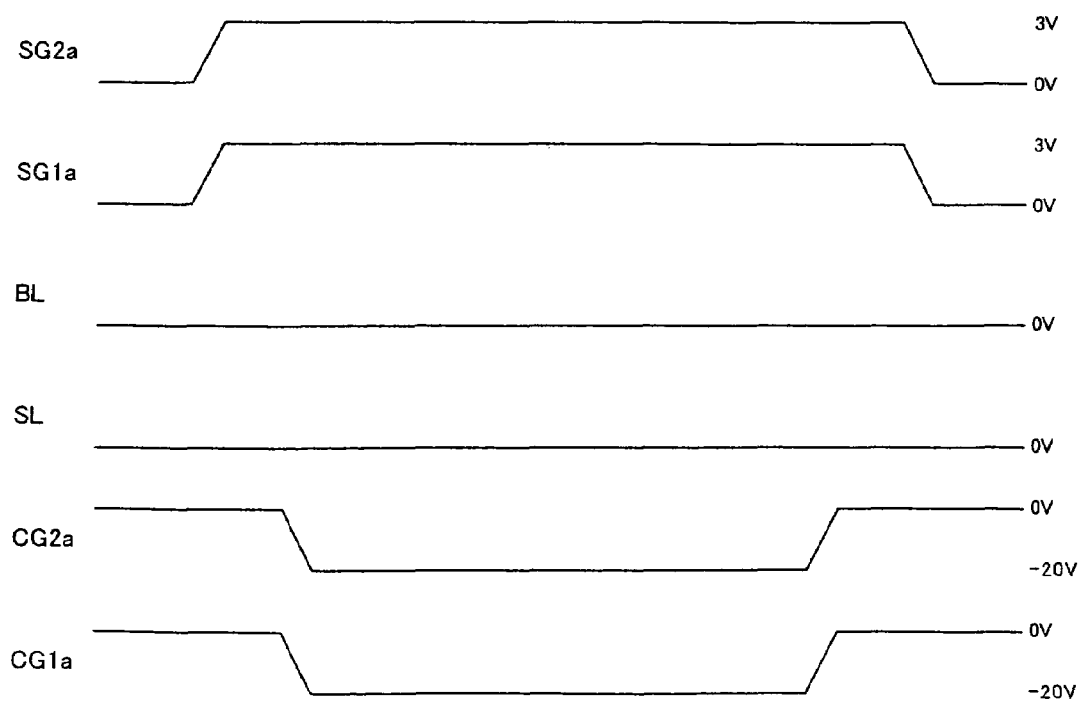
FIG. 14 is a timing chart for application of voltages in an erasing operation according to the second embodiment of the present invention.

FIG. 14 is a timing chart for the application of the respective voltages for the erasing operation according to this embodiment. Where the memory cells connected to the control gate lines CG1*a*, CG2*a* are to be subjected to the erasing operation, 0V is first applied to the control gate lines CG1*a*, CG2*a*, the selection gate lines SG2*a*, SG1*a*, the source line SL and the bit lines BL, and then a power source voltage of 3V is applied to the selection gate lines SG1*a*, SG2*a*. Thereafter, −20V is applied to the control gate lines CG1*a*, CG2*a*.

For the other memory cells not subjected to the erasing operation, 0V is applied to the corresponding control gate lines for prevention of the erasing. When the erasing operation is finished, 0V is applied to the control gate lines CG1*a*, CG2*a*. Then, 0V is applied to the selection gate lines SG2*a*, SG1*a*.

Third Embodiment

Figure 15:
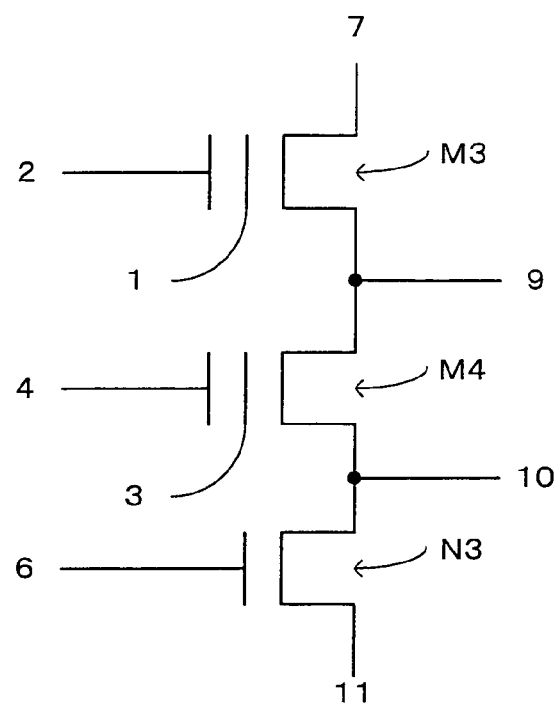
FIG. 15 is an equivalent circuit diagram of a nonvolatile semiconductor device to which a driving method according to a third embodiment of the present invention is applicable.

FIG. 15 is an equivalent circuit diagram illustrating a memory cell unit including a single selection transistor according to a third embodiment. A memory cell unit array according to this embodiment has substantially the same construction as shown in FIG. 11. The memory cell unit is a flash memory of a type which includes one or more memory cells (two memory cells M3, M4 in this embodiment) and a single selection transistor N3. An explanation will be given to a driving method for this flash memory.

Writing Operation

Where electrons are to be injected into a charge storage layer 1 of the memory cell M3 in any one of selected memory cell units by a tunnel current for a writing operation, a high voltage VH1 is applied to a control gate 2, and a voltage VH2 (VH1>VH2) such as to prevent the writing is applied to a control gate 4. A voltage VH4 which is one half a writing prevention voltage VH5 to be applied to bit lines is applied to a selection gate 6 and a source terminal 11, and a drain terminal 7 of the memory cell unit subjected to the electron injection is grounded.

The writing to memory cells not subjected to the electron injection in the selected memory cell units is prevented by applying the writing prevention voltage VH5 to bit lines connected to these memory cells.

By grounding the drain terminal 7 of the memory cell unit subjected to the electron injection, N-type diffusion layers 9, 10 are kept at a grounding potential. However, the electrical connection between the N-type diffusion layer 10 and the source terminal 11 is prevented by the positive voltage VH4 applied to the selection gate 6.

Then, the floating channel is at the grounding potential, so that a potential difference which is equivalent to a difference between the high voltage VH1 and the grounding potential occurs between the control gate 2 and the floating channel. At this time, electrons are injected into the charge storage layer 1 from the floating channel by an FN tunnel current. The threshold voltage of the memory cell M3 is positively shifted by the electron injection. At this time, a potential difference which is equivalent to the voltage VH4 occurs between the floating channel and the source terminal 11. However, a breakdown phenomenon due to an insufficient breakdown voltage is prevented, because the selection gate 6 has a breakdown voltage not lower than the voltage VH4. On the other hand, the voltage VH2 (VH1>VH2) such as to prevent the writing is applied to the control gate 4 of the memory cell M4, whereby the electron injection to the charge storage layer 3 of the memory cell M4 is prevented. Hence, the threshold of the memory cell M4 is kept unchanged.

Where electrons are to be injected into the charge storage layer 3 of the memory cell M4, a high voltage VH1 is applied to the control gate 4, and a voltage VH2 (VH1>VH2) such as to prevent the writing is applied to the control gate 2. A voltage VH4 which is one half the writing prevention voltage VH5 to be applied to bit lines is applied to the selection gate 6 and the source terminal 11, and the drain terminal 7 is grounded. With the drain terminal 7 being grounded, the N-type diffusion layers 9, 10 are kept at a grounding potential. However, the electrical connection between the N-type diffusion layer 10 and the source terminal 11 is prevented by the positive voltage VH4 applied to the selection gate 6. Then, the floating channel is at the grounding potential, so that a potential difference which is equivalent to a difference between the high voltage VH1 and the grounding potential occurs between the control gate 4 and the floating channel. At this time, electrons are injected into the charge storage layer 3 from the floating channel by a tunnel current. The threshold voltage of the memory cell M4 is positively shifted by the electron injection. At this time, a potential difference which is equivalent to the voltage VH4 occurs between the floating channel and the source terminal 11. However, a breakdown phenomenon due to an insufficient breakdown voltage is prevented, because the selection gate 6 has a breakdown voltage not lower than the voltage VH4. Further, the voltage VH2 (VH1>VH2) such as to prevent the writing is applied to the control gate 2 of the memory cell M3, whereby the electron injection to the charge storage layer 1 of the memory cell M3 is prevented. Hence, the threshold of the memory cell M3 is kept unchanged.

Figure 16:
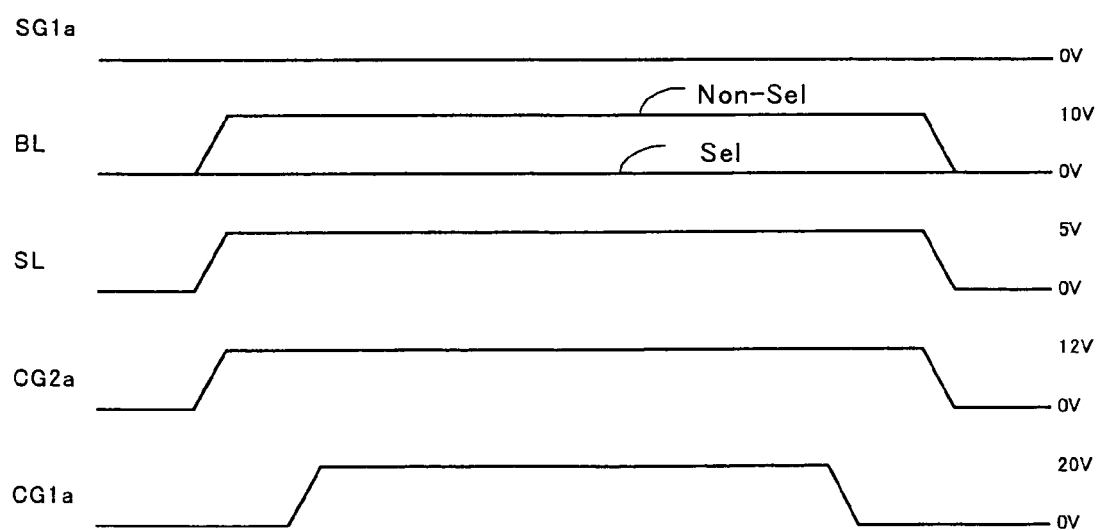
FIG. 16 is a timing chart for application of voltages in a writing operation according to the third embodiment of the present invention.

FIG. 16 is an exemplary timing chart for the application of the respective voltages for the writing operation according to this embodiment. In FIG. 16, the voltages to be applied to the selection gate line, the control gate lines, the source line and the bit lines and the timing for the voltage application are the same as in the second embodiment.

Erasing Operation

An explanation will be given to a driving method for releasing electrons from the charge storage layers of the memory cells M3, M4. A power supply voltage VCC is applied to the selection gate 6, and the bit lines and the source line are grounded. Thereafter, a negative voltage VN1 is applied to the control gates 2, 4. Thus, a potential difference which is equivalent to a difference between the negative voltage VN1 and the grounding potential occurs between the control gates 2, 4 and the floating channels. At this time, electrons are released from the charge storage layers 1, 3 into the floating channels by a tunnel current. The threshold voltages of the memory cells M3, M4 are negatively shifted by the release of the electrons.

Figure 17:
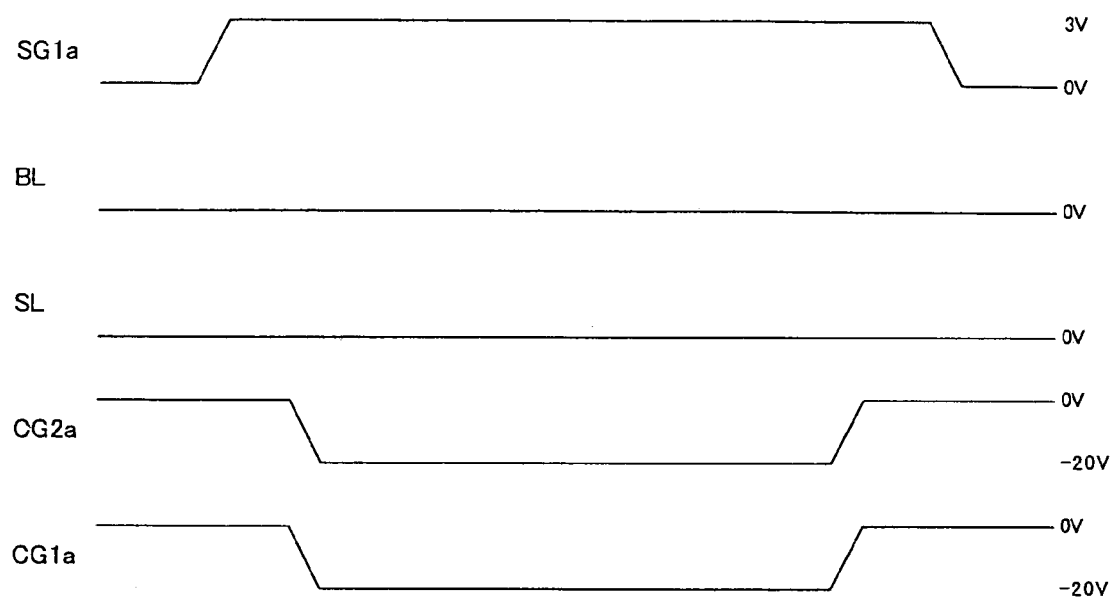
FIG. 17 is a timing chart for application of voltages in an erasing operation according to the third embodiment of the present invention.

FIG. 17 is a timing chart for the application of the respective voltages for the erasing operation according to this embodiment. In FIG. 17, the voltages to be applied to the selection gate line, the control gate lines, the source line and the bit lines and the timing for the voltage application are the same as in the second embodiment.

What is claimed is:

1. A memory cell array driving method for performing a writing operation on a selected memory cell in a memory cell array which includes a plurality of memory cell units arranged longitudinally and transversely in a matrix configuration and control gate lines, the memory cell units each comprising a semiconductor substrate having a high concentration impurity diffusion layer provided as a source diffusion layer in at least a part of a surface thereof, a column-shaped semiconductor layer provided on the semiconductor substrate perpendicularly to the semiconductor substrate and having a drain diffusion layer provided in an uppermost portion thereof and a first low concentration impurity diffusion layer provided in an entire bottom portion thereof, the column-shaped semiconductor layer being electrically isolated from the semiconductor substrate, a memory cell arrangement which includes a plurality of memory cells provided in a peripheral wall of the column-shaped semiconductor layer and connected in series perpendicularly to the substrate, the memory cells each having a charge storage layer and a control gate, a second impurity diffusion layer provided at a lower end of the memory cell arrangement, and a selection transistor connecting the second impurity diffusion layer and the first impurity diffusion layer, the control gates of the memory cells in the memory cell units being connected commonly to the corresponding control gate lines, the driving method comprising the steps of:

(s1) applying a positive source voltage to the source diffusion layers of the respective memory cell units;

(s2) applying a grounding voltage to a drain diffusion layer of a memory cell unit including the selected memory cell;

(s3) applying a writing voltage to a control gate line connected to the selected memory cell; and (s4) applying a writing prevention voltage to drain diffusion layers of memory cell units not including the selected memory cell for prevention of writing to unselected memory cells which share the control gate line connected to the selected memory cell.

2. The memory cell array driving method of claim 1, wherein a group of the steps s1, s2 and s4 are executed firstly in time-staggered manner or simultaneously, and the step s3 is executed lastly.

3. The memory cell array driving method of claim 1, wherein the source voltage is not higher than the writing prevention voltage.

4. The memory cell array driving method of claim 1, wherein the selection transistor has a breakdown voltage not lower than one half the writing prevention voltage, and the source voltage is one half the writing prevention voltage.

5. A memory cell array driving method for performing a writing operation on a selected memory cell in a memory cell array including a plurality of memory cell units arranged longitudinally and transversely in a matrix configuration and control gate lines, the memory cell units each comprising a semiconductor substrate having a high concentration impurity diffusion layer provided as a source diffusion layer in at least a part of a surface thereof, a column-shaped semiconductor layer provided on the semiconductor substrate perpendicularly to the semiconductor substrate with a part of a bottom thereof being in contact with the source diffusion layer, and having a drain diffusion layer provided in an uppermost portion thereof and a first low concentration impurity diffusion layer provided in an entire bottom portion thereof, a memory cell arrangement which includes a plurality of memory cells provided in a peripheral wall of the column-shaped semiconductor layer and connected in series perpendicularly to the substrate, the memory cells each having a charge storage layer and a control gate, a second impurity diffusion layer provided at a lower end of the memory cell arrangement, and a selection transistor connecting the second impurity diffusion layer and the first impurity diffusion layer, the control gates of the memory cells in the memory cell units being connected commonly to the corresponding control gate lines, the driving method comprising the steps of:

(s1) applying a positive source voltage to the source diffusion layers of the respective memory cell units;

(s2) applying a grounding voltage to a drain diffusion layer of a memory cell unit including the selected memory cell;

(s3) applying a writing voltage to a control gate line connected to the selected memory cell; and (s4) applying a writing prevention voltage to drain diffusion layers of memory cell units not including the selected memory cell for prevention of writing to unselected memory cells which share the control gate line connected to the selected memory cell.

6. The memory cell array driving method of claim 5, wherein a group of the steps s1, s2 and s4 are executed firstly in time-staggered manner or simultaneously, and the step s3 is executed lastly.

7. The memory cell array driving method of claim 5, wherein the source voltage is not higher than the writing prevention voltage.

8. The memory cell array driving method of claim 5, wherein the selection transistor has a breakdown voltage not lower than one half the writing prevention voltage, and the source voltage is one half the writing prevention voltage.

* * * * *